(12) United States Patent
Woo et al.

(10) Patent No.: US 9,296,864 B2
(45) Date of Patent: Mar. 29, 2016

(54) POLYMER MATERIAL FOR HIGHLY EFFICIENT ORGANIC THIN-FILM SOLAR CELL, AND ORGANIC THIN-FILM SOLAR CELL USING SAME

(71) Applicants: PUSAN NATIONAL UNIVERSITY INDUSTRY—UNIVERSITY COOPERATION FOUNDATION, Busan (KR); UNIST ACADEMY—INDUSTRY RESEARCH CORPORATION, Ulsan (KR)

(72) Inventors: Han Young Woo, Yangsan-si (KR); Jin Young Kim, Ulsan (KR); Won Ho Lee, Busan (KR); Thanh Luan Nguyen, Miryang-si (KR); Mohammad Afsar Uddin, Miryang-si (KR); Hyo Sung Choi, Busan (KR); Seo Jin Ko, Jeonju-si (KR)

(73) Assignees: Pusan National University Industry-University Cooperation Foundation, Busan (KR); UNIST ACADEMY-INDUSTRY RESEARCH CORPORATION, Ulsan (KR)

( * ) Notice: Subject to any disclaimer, the term of this patent is extended or adjusted under 35 U.S.C. 154(b) by 0 days.

(21) Appl. No.: 14/765,567
(22) PCT Filed: Feb. 3, 2014
(86) PCT No.: PCT/KR2014/000909
§ 371 (c)(1),
(2) Date: Aug. 3, 2015
(87) PCT Pub. No.: WO2014/119962
PCT Pub. Date: Aug. 7, 2014

(65) Prior Publication Data
US 2015/0361223 A1 Dec. 17, 2015

(30) Foreign Application Priority Data
Feb. 1, 2013 (KR) .................. 10-2013-0012079

(51) Int. Cl.
*H01L 51/00* (2006.01)
*C08G 61/02* (2006.01)
(Continued)

(52) U.S. Cl.
CPC .............. *C08G 75/32* (2013.01); *C08G 61/126* (2013.01); *C08G 73/0611* (2013.01);
(Continued)

(58) Field of Classification Search
CPC ...... C08G 75/32; C08G 61/126; C08G 61/02; C08G 61/123; C08G 73/0611; C08G 2261/124; C08G 2261/1424; C08G 2261/143; C08G 2261/3142; C08G 2261/3223; C08G 2261/3246; C08G 2261/91; H01L 51/0036; H01L 51/0043; H01L 51/0007; H01L 51/0026; H01L 51/0053; H01L 51/0508; H01L 51/0545; H01L 51/42; H01L 51/4253
USPC ......... 136/252, 256, 258, 260, 261, 262, 263, 136/264, 265
See application file for complete search history.

(56) References Cited

U.S. PATENT DOCUMENTS

2011/0315225 A1* 12/2011 Choi ................... B82Y 10/00
136/263

FOREIGN PATENT DOCUMENTS

KR 10-2010-0113218 A 10/2010

OTHER PUBLICATIONS

Carle, Jon Eggert, et al. "Low band gap polymers based on 1,4-dialkoxybenzene, thiophene, bithiophene donors and the benzothiadiazole acceptor" Solar Energy Materials & Solar Cells, vol. 94, pp. 774-780 (2010).
(Continued)

*Primary Examiner* — Susan D Leong
(74) *Attorney, Agent, or Firm* — JaeYoun Kim; Novick, Kim & Lee, PLLC

(57) ABSTRACT

The present invention relates to a novel polymeric material for a highly efficient organic thin-film solar cell with high hole mobility and power conversion efficiency. In the polymeric material, a compound containing an electron donating group represented by Formula 1 or 2 and a compound containing an electron accepting group represented by one of Formulae 3 to 8 are repeatedly introduced in an alternating manner.

10 Claims, 35 Drawing Sheets

(51) Int. Cl.
*C08G 75/32* (2006.01)
*C08G 73/06* (2006.01)
*H01L 51/05* (2006.01)
*H01L 51/42* (2006.01)
*C08G 61/12* (2006.01)

(52) U.S. Cl.
CPC ....... *H01L 51/0036* (2013.01); *H01L 51/0043* (2013.01); *C08G 61/02* (2013.01); *C08G 61/123* (2013.01); *C08G 2261/124* (2013.01); *C08G 2261/143* (2013.01); *C08G 2261/146* (2013.01); *C08G 2261/1424* (2013.01); *C08G 2261/3142* (2013.01); *C08G 2261/3223* (2013.01); *C08G 2261/3246* (2013.01); *C08G 2261/91* (2013.01); *H01L 51/0007* (2013.01); *H01L 51/0026* (2013.01); *H01L 51/0053* (2013.01); *H01L 51/0508* (2013.01); *H01L 51/0545* (2013.01); *H01L 51/42* (2013.01); *H01L 51/4253* (2013.01); *Y02E 10/549* (2013.01); *Y02P 70/521* (2015.11)

(56) References Cited

OTHER PUBLICATIONS

Liu, Cheng-Liang, et al. "New Didecyloxyphenylene-Acceptor Alternating Conjugated Copolymers: Synthesis, Properties, and Optoelectronic Device Applications" Macromolecules, vol. 41, No. 19, pp. 6952-6959 (2008).

Carle, Jon Eggert, et al. "Polymers for organic photovoltaics based on 1,5-bis(2-hexyldecyloxy)-naphthalene, thiophene, and benzothiadiazole" Journal of Photonics for Engergy, vol. 1 (2011).

* cited by examiner

| PPDT2FBT with (w/) and without(w/o) additive | Electron mobility $(cm^2V^{-1}s^{-1})$ | Hole mobility $(cm^2V^{-1}s^{-1})$ | Electron/Hole fraction | Hole/Electron fraction | Thickness (nm) |
|---|---|---|---|---|---|
| 2F DCB w/o DPE | $1.3 \times 10^{-4}$ | $1.8 \times 10^{-4}$ | 0.72 | 1.38 | 86 |
| 2F DCB w/ DPE | $5.3 \times 10^{-3}$ | $3.7 \times 10^{-3}$ | 1.43 | 0.69 | 108 |
| 2F CB w/o DPE | $2.2 \times 10^{-4}$ | $6.5 \times 10^{-4}$ | 0.34 | 2.95 | 110 |
| 2F CB w/ DPE | $6.2 \times 10^{-3}$ | $3.0 \times 10^{-3}$ | 2.06 | 0.48 | 360 |

Fig. 18c

POLYMER MATERIAL FOR HIGHLY EFFICIENT ORGANIC THIN-FILM SOLAR CELL, AND ORGANIC THIN-FILM SOLAR CELL USING SAME

TECHNICAL FIELD

The present invention relates to a novel polymeric material for a highly efficient organic thin-film solar cell and a highly efficient organic thin-film solar cell using the same.

BACKGROUND ART

Solar cells have received attention as inexhaustible, renewable, and environmentally friendly electrical energy sources. At present, first generation crystalline solar cells using inorganic materials (typified by silicon crystalline solar cells) account for 90% of the photovoltaic power generation market. However, first generation crystalline solar cells generate electricity at 5 to 20 times higher cost than coal, petroleum, and natural gas and are thus not considered profitable. Under these circumstances, second generation crystalline solar cell technologies have emerged as promising alternatives to first generation crystalline solar cells. The total market share of second generation thin-film solar cells, including silicon (5.2%), CdTe (4.7%), and CIGS (0.5%) thin-film solar cells, is estimated to be 10% but is still unsatisfactory. Second generation solar cell technologies involve troublesome device fabrication processes and require expensive equipment, incurring considerable costs. The increased costs are mainly attributed to processes for providing semiconductor thin films under vacuum at high temperature. Thus, organic polymer solar cells are investigated as new possibilities because they can be fabricated at greatly reduced costs by low temperature solution processing. Organic polymer-based energy materials possess low power conversion efficiency values compared to inorganic materials but are gaining more importance due to their many advantages, such as ease of device fabrication, mechanical flexibility, ease of molecular design, and low price.

The biggest challenge in organic solar cells using organic semiconductors, such as conjugated polymers, is lower power conversion efficiency than conventional solar cells using inorganic semiconductors. For this reason, organic solar cells using organic semiconductors have not yet been put into practical use. There are three major reasons for the low power conversion efficiency of conventional solar cells using conjugated polymers. The first reason is low sunlight absorption efficiency. The second reason is that excitons generated in organic semiconductors by sunlight are difficult to separate into electrons and holes due to their high binding energy. The third reason is that traps capable of readily capturing carriers (electrons and holes) are easy to form, causing low carrier mobility. Semiconductor materials are generally required to have high carrier mobility. Nevertheless, conjugated polymers suffer from the problem of lower mobility of charged carriers than conventional inorganic crystalline semiconductors and amorphous silicon.

For these reasons, developments of approaches to absorb much sunlight and facilitate the separation of created electrons and holes from excitons and approaches to improve the mobility of carriers by suppressing scattering of carriers or capture of carriers by traps between amorphous areas and chains of conjugated polymers are crucial keys for practical application of organic semiconductor solar cells.

Photovoltaic devices using organic semiconductors known hitherto are generally classified into the following device constructions, for example: Schottky junctions where electron donating organic materials (p-type organic semiconductors) are bonded to low work function metals; and heterojunctions where electron accepting organic materials (n-type organic semiconductors) are bonded to electron donating organic materials (p-type organic semiconductors). These devices have low power conversion efficiency values because only the organic layers (water molecule layers) around the junctions contribute to photocurrent generation. Further improvements are thus needed in power conversion efficiency.

One approach to power conversion efficiency improvement is to develop bulk heterojunction photovoltaic devices in which electron accepting organic materials are mixed with electron donating organic materials and junction areas are increased to contribute to power conversion. Among them, photovoltaic devices were reported in which conjugated polymers are used as electron donating organic materials and semiconductor polymers having n-type semiconductor characteristics, for example, C60 fullerene derivatives, are used as electron accepting organic materials.

Organic solar cells based on bulk heterojunction structures have recorded low efficiencies of at most ~1% in the early stage of development but have achieved efficiencies of 4-6% by the use of P3HT as a photoactive layer material. Since low band gap organic materials were invented, organic solar cells with high efficiencies of ≥7% have been reported. Low band gap polymers undergo intramolecular charge transfer (ICT) from electron-rich monomers to electron-deficient monomers. This phenomenon leads to a reduction in band gap, resulting in efficient absorption of sunlight over a broad range of wavelengths.

The most serious problem of current polymer solar cells is considerably low power conversion efficiency compared to that (about 20%) of structures using inorganic materials, such as silicon and CIGS. Active layers serving to convert absorbed sunlight to electricity play an important role in the development of highly efficient organic solar cells. There is thus a need to develop novel active layer materials with higher efficiency through processing condition optimization. To this end, it would be essential to develop low band gap polymers with broad absorption bands and high molar extinction coefficients capable of effectively absorbing sunlight, improve hole and electron mobilities for excellent photocurrent characteristics, control the electronic structure of polymers for high open-circuit voltage, and develop multilayer polymer solar cell technologies.

DETAILED DESCRIPTION OF THE INVENTION

Problems to be Solved by the Invention

Thus, an object of the present invention is to provide a novel polymer as an organic material for a highly efficient organic thin-film solar cell.

A further object of the present invention is to provide an organic thin-film solar cell using the polymer as a material for a sunlight-absorbing photoactive layer.

Another object of the present invention is to provide a method for fabricating a highly efficient organic thin-film solar cell.

Still another object of the present invention is to provide an organic thin-film transistor using the polymer as an active material.

Means for Solving the Problems

One aspect of the present invention provides a polymer in which a compound containing an electron donating group represented by Formula 1 or 2:

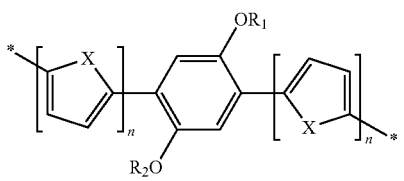
(1)

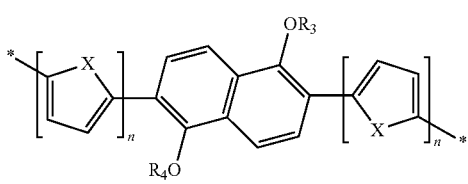
(2)

(wherein the moieties X are the same or different and each represents CRR', NR, O, SiRR', PR, S, GeRR', Se or Te; R and R' are the same or different and each represents a $C_1$-$C_{30}$ linear or branched alkyl group; $R_1$, $R_2$, $R_3$, and $R_4$ are the same or different and each represents a $C_8$-$C_{30}$ linear or branched alkyl group; and the subscripts n are the same or different and each represents an integer from 1 to 3), and a compound containing an electron accepting group represented by one of Formulae 3 to 8:

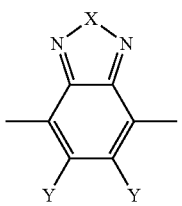
(3)

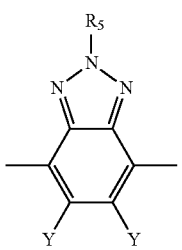
(4)

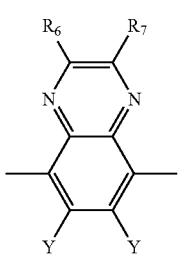
(5)

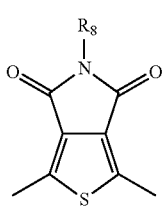
(6)

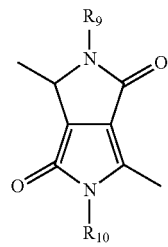
(7)

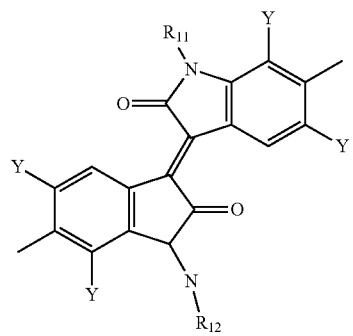
(8)

(wherein X, R, and R' are as defined in Formula 1 or 2; the groups Y are the same or different and each represents H, F, Cl or CN; and $R_5$, $R_6$, $R_7$, $R_8$, $R_9$, $R_{10}$, $R_{11}$, and $R_{12}$ are the same or different and each represents a $C_8$-$C_{30}$ linear or branched alkyl group) are repeatedly introduced in an alternating manner.

The compound containing an electron donating group may be represented by Formula 1 and the compound containing an electron accepting group may be represented by Formula 3. More preferably, the polymer of the present invention is selected from compounds represented by Formulae 9 to 11:

(9)

(10)

(11)

wherein each n is independently an integer from 1 to 3, each m is independently an integer from 10 to 100, and $R_{13}$, $R_{14}$, $R_{15}$, $R_{16}$, $R_{17}$, and Rig are the same or different and each represents a $C_8$-$C_{30}$ linear or branched alkyl group.

Preferably, the polymer of the present invention has a number average molecular weight of 10,000 g/mol to 100,000 g/mol.

A further aspect of the present invention provides a method for fabricating an organic thin-film solar cell, including forming a sunlight-absorbing photoactive layer including the polymer by the use of chlorobenzene as a solvent and the addition of diphenyl ether as an additive.

Another aspect of the present invention provides an organic thin-film solar cell which includes a sunlight-absorbing photoactive layer including the polymer and is preferably fabricated by the method.

Preferably, the organic thin-film solar cell further includes a buffer layer formed between a cathode layer and the sunlight-absorbing photoactive layer and including a poly(fluorene-phenylene)-based conjugated polymer electrolyte (CPE). More preferably, the conjugated polymer electrolyte is poly[9,9-bis(6'-(N,N,N-trimethylammonium)hexyl)fluorene-alt-phenylene] with bromide (PAHFP-Br).

Yet another aspect of the present invention provides an organic thin-film transistor including the polymer as an active material.

Effects of the Invention

The novel polymeric material of the present invention is an ICT type polymer of an electron-rich monomer and an electron-deficient monomer and can be used to fabricate a highly efficient organic thin-film solar cell with high hole mobility and power conversion efficiency. The polymer of the present invention can be used as a material for a photoactive layer of an organic thin-film solar cell device. The use of the polymer allows the device to have high power conversion efficiency (PCE).

BEST MODE FOR CARRYING OUT THE INVENTION

Figure 1:
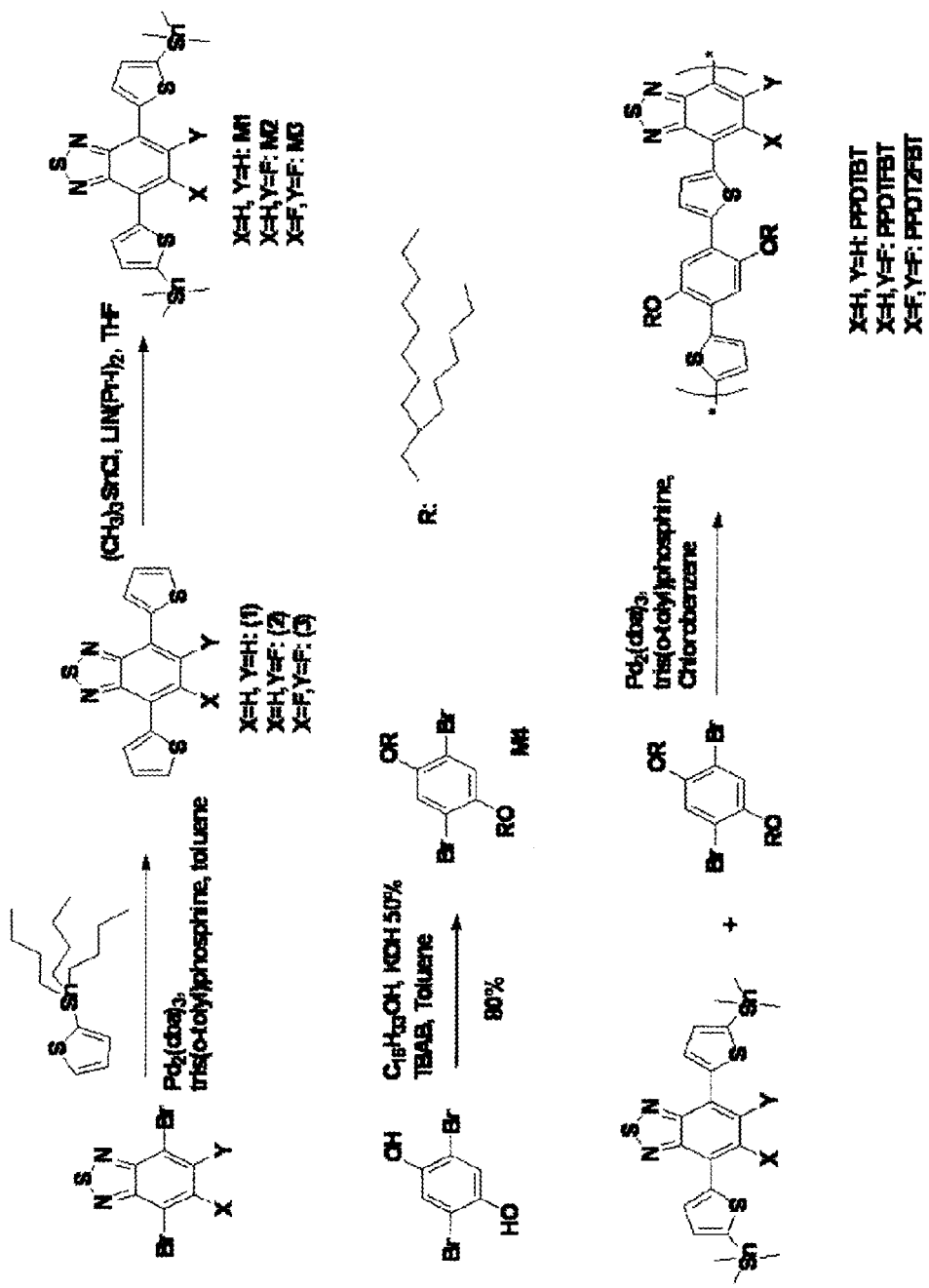
FIG. 1 shows the mechanism of synthesis of a polymer according to one embodiment of the present invention.

The present invention is directed to a novel polymeric material for a highly efficient organic thin-film solar cell with high hole mobility and power conversion efficiency. The polymeric material of the present invention is an ICT type polymer of an electron-rich monomer and an electron-deficient monomer. The present invention is also directed to an organic thin-film solar cell with outstanding power conversion efficiency which includes a photoactive layer including the polymer.

The present invention will now be described in detail.

In a first aspect, the present invention provides a polymer in which a compound containing an electron donating group represented by Formula 1 or 2:

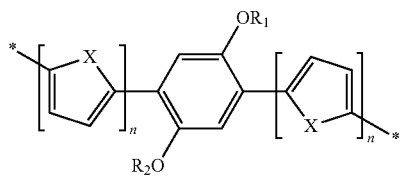

(1)

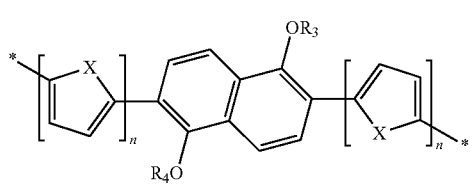

(2)

(wherein the moieties X are the same or different and each represents CRR', NR, O, SiRR', PR, S, GeRR', Se or Te; R and R' are the same or different and each represents a $C_1$-$C_{30}$ linear or branched alkyl group; $R_1$, $R_2$, $R_3$, and $R_4$ are the same or different and each represents a $C_8$-$C_{30}$ linear or branched alkyl group; and the subscripts n are the same or different and each represents an integer from 1 to 3), and a compound containing an electron accepting group represented by one of Formulae 3 to 8:

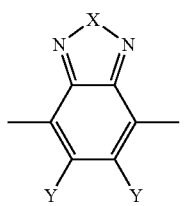

(3)

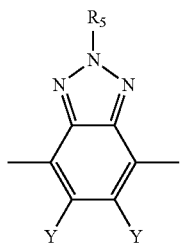

(4)

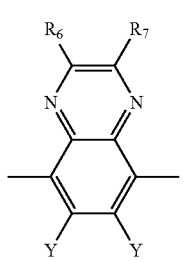

(5)

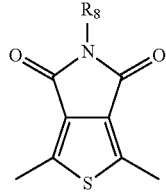

(6)

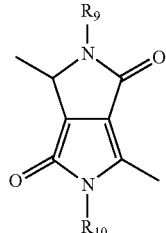

(7)

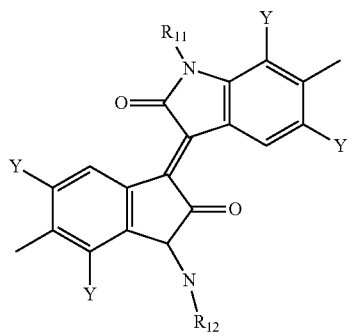

(8)

(wherein X, R, and R' are as defined in Formula 1 or 2; the groups Y are the same or different and each represents H, F, Cl or CN; and $R_5$, $R_6$, $R_7$, $R_8$, $R_9$, $R_{10}$, $R_{11}$, and $R_{12}$ are the same or different and each represents a $C_8$-$C_{30}$ linear or branched alkyl group) are repeatedly introduced in an alternating manner.

The compound represented by one of Formulae 3 to 8 is included in the polymer of the present invention and includes benzothiadiazole, benzoselenadiazole, benzoxadiazole, benzotriazole, quinoxaline, benzothienopyrroledione, diketopyrrolopyrrole or isoindigo with high electron affinity as an electron accepting group. The presence of the electron accepting group lowers the HOMO energy level of the polymer and allows the polymer to have a high open-circuit voltage. Particularly, one or two —F, —Cl or —CN are introduced into the electron accepting group to increase the electron affinity of the electron accepting group. The interactions between electrons decrease the torsional angle to improve the intermolecular packing characteristics while maintaining the planarity of the polymer backbone, contributing to an improvement in charge mobility.

In an organic thin-film solar cell, a high molecular weight (Mn>20,000) polymer is preferred for uniform thin film formation and high efficiency. However, the solubility of the polymer decreases with increasing molecular weight, making it difficult to form a uniform thin film. In the present invention, the solubility of the polymer is improved and the molecular weight of the polymer is increased by the introduction of alkoxy groups. This facilitates the formation of a uniform thin film, achieving high power conversion efficiency (PCE).

In the polymer of the present invention, the compound containing an electron donating group is preferably represented by Formula 1 and the compound containing an electron accepting group is preferably represented by Formula 3. The compound of Formula 1 includes a dialkoxyphenylene moiety as the electron donating group and the compound of Formula 3 includes a benzodiazole moiety as the electron accepting group. More preferably, the polymer of the present invention is selected from compounds represented by Formulae 9 to 11:

(9)

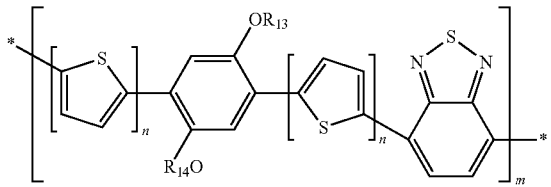

(10)

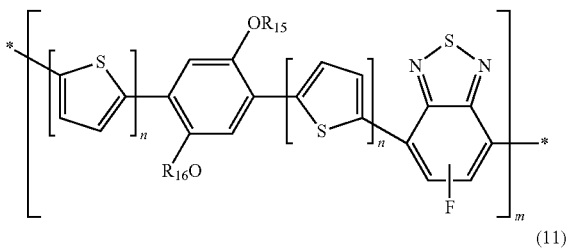

(11)

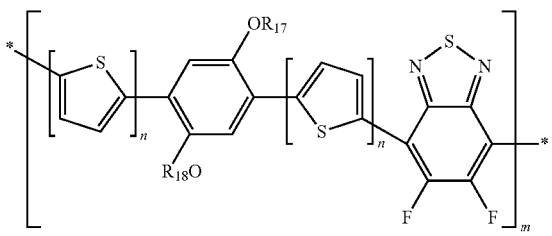

wherein each n is independently an integer from 1 to 3, each m is independently an integer from 10 to 100, and $R_{13}$, $R_{14}$, $R_{15}$, $R_{16}$, $R_{17}$, and $R_{18}$ are the same or different and each represents a $C_8$-$C_{30}$ linear or branched alkyl group.

In the polymer of the present invention, the compound represented by Formula 1 or 2 and the compound represented by one of Formulae 3 to 8 are repeatedly introduced in an alternating manner. The noncovalent interactions between X—O and Y—X decrease the torsional angle to maintain the planarity of the polymer backbone. Particularly, the interactions between X—O and Y—X improve the intermolecular packing characteristics, contributing to an improvement in charge mobility.

In a second aspect, the present invention provides a method for fabricating an organic thin-film solar cell, including forming a sunlight-absorbing photoactive layer including the polymer by the use of chlorobenzene as a solvent and the addition of diphenyl ether as an additive.

More specifically, a conventional-type organic thin-film solar cell having a substrate/transparent electrode/photoactive layer/metal electrode structure can be fabricated by the following procedure.

First, a transparent electrode material is coated on a substrate. The substrate may be any of those that are used in general organic thin-film solar cells. Preferred is a glass or transparent plastic substrate that has high transparency, is easy to handle, and has excellent airtightness and waterproofing properties. Examples of suitable transparent electrode materials include highly transparent and conductive indium tin oxide (ITO), tin oxide ($SnO_2$), carbon nanotubes, and graphene. The organic thin-film solar cell may include a hole transport layer. A material for the hole transport layer is typically poly(styrenesulfonic acid) (PSS)-doped poly(34-ethyelendioxythiophene) (PEDOT) (PEDOT:PSS) but is not particularly limited thereto.

Next, the polymer of the present invention is used to form a photoactive layer. A blend solution of the polymer and an electron acceptor, such as a fullerene derivative, is necessary for the formation of the photoactive layer. The polymer is preferably mixed with the fullerene derivative in a weight ratio of 1:0.1 to 1:10, more preferably 1:0.5 to 1:4. The viscosity of the polymer solution may be easily adjusted and the thickness of the photoactive layer may be controlled by varying the solids content of the polymer solution. The solvent may be one that is highly miscible with the polymer and the fullerene derivative.

In the Examples section that follows, it was confirmed that the reaction profile of the additive varied depending on the kind of the solvent to change the morphology of the photoactive layer, achieving significantly increased efficiency (8.64%) of the organic thin-film solar cell device. In the method of the present invention, diphenyl ether as the additive is introduced in the photoactive layer and chlorobenzene is used as the solvent. As a result, effective phase separation between the polymer of the present invention and the fullerene derivative can be induced due to selective solubility of the polymer and the fullerene derivative for the additive and depending on the boiling point of the additive. This improves the efficiency and thermal stability of the organic thin-film solar cell so that the power conversion efficiency can be maintained.

Next, the photoactive layer is formed by applying the blend solution of the polymer and the fullerene derivative onto the substrate. The application of the blend solution may be accomplished by any suitable technique known in the art, such as doctor blade coating, spray printing, gravure printing or ink printing. The thickness of the photoactive layer is preferably from about 50 to about 500 nm, more preferably from 100 to 200 nm. Optionally, the photoactive layer may be dried at a low temperature of about 50 to about 150° C.

The polymer of the present invention has high photon absorption efficiency and improved solubility due to its structural features, as explained above. Accordingly, the use of the polymer improves the morphology of the device, achieving much higher efficiency than poly(3-hexylthiophene) (P3HT) used in conventional organic thin-film solar cell devices.

Finally, a metal electrode material is coated. The metal electrode material is typically aluminum (Al), which may be used together with a low work function metal, such as lithium (Li), magnesium (Mg), calcium (Ca) or barium (Ba).

In a third aspect, the present invention provides an organic thin-film solar cell which includes a sunlight-absorbing photoactive layer including the polymer.

The organic thin-film solar cell of the present invention is preferably fabricated by the above method.

Preferably, the organic thin-film solar cell further includes a buffer layer formed between a cathode layer and the sunlight-absorbing photoactive layer and including a poly(fluorene-phenylene)-based conjugated polymer electrolyte. The work function of the material varies to control the difference in energy between the respective layers. As a result, the harvesting efficiency of electrons is increased to induce an improvement in short-circuit current, achieving improved efficiency of the device. More preferably, the conjugated polymer electrolyte is poly[9,9-bis(6'-(N,N,N-trimethylammonium)hexyl)fluorene-alt-phenylene] with bromide (PAHFP-Br) as a cationic polymer.

In a fourth aspect, the present invention provides an organic thin-film transistor including the polymer as an active material.

The polymer may be coated by a general technique, such as spin coating, to fabricate the organic thin-film transistor device. Specifically, the organic thin-film transistor device may be fabricated by the following procedure. First, a gate insulating layer is formed on a gate electrode substrate and an organic semiconductor layer using the polymer of the present invention is formed thereon. Thereafter, metal electrodes as drain and source electrodes are formed on the organic semiconductor layer. Alternatively, the organic thin-film transistor device may be fabricated by forming drain and source electrodes on a substrate, forming an organic semiconductor layer using the polymer thereon, forming an insulating layer on the organic semiconductor layer, and forming a gate electrode on the insulating layer. That is, the polymer can be applied to various types (such as bottom gate and top gate types) of thin film transistors.

Generally, the organic thin-film transistor is thermally annealed. The annealing is performed in a state in which the film is fixed to the substrate. The annealing temperature is determined depending on the characteristics of the polymer but is preferably from room temperature to 300° C., more preferably from 80 to 150° C. The polymer of the present invention is annealed at a temperature of at least 130° C. If the annealing temperature is excessively low, the organic solvent remaining in the organic film cannot be easily removed. Meanwhile, if the annealing temperature is excessively high, the organic film may be thermally decomposed. The annealing is preferably performed in vacuo or under a nitrogen, argon or ambient atmosphere. The annealing time is appropriately determined depending on the aggregation rate of the polymer.

The polymer of the present invention may also be used as an electrically conductive material, a semiconductive material, a photoconductive material, a luminescent material, an electrode material or a charge transfer material to fabricate organic electronic devices and modules, including organic light-emitting devices and organic memories.

Mode For Carrying Out The Invention

The present invention will be explained in more detail with reference to the following examples. However, these examples are not intended to limit the scope of the invention.

SYNTHESIS EXAMPLE 1

Synthesis of Precursors

5-Fluoro-4,7-di(thiophen-2-yl)-2,1,3-benzothiadiazole and 5,6-difluoro-4,7-di(thiophen-2-yl)-2,1,3-benzothiadiazole were synthesized as polymer precursors according to the procedures reported in the literature [Samuel C. Price, Andrew C. Stuart, Liquing Yang, Huaxing Zhou, and Wei You, J. Am. Soc. 2011, 133, 4625-4631; Huaxing Zhou, Liqiang Yang, Andrew C. stuart, Samuel C. Price, Shubin Liu, and Wei You, Angew. Chem. Int. Ed. 2011, 50, 2995-2998].

SYNTHESIS EXAMPLE 2

Synthesis of Polymers 4,7-Di(thiophen-2-yl)-2,1,3-benzothiadiazole (1)

4,7-Dibromo-2,1,3-benzothiadiazole (2 g, 6.8 mmol), 2-(tributylstannyl)thiophene (5.3 g, 2.1 eq.), 2 mol % of tris(dibenzylidene acetone)dipalladium (0)), and 8 mol % of tri(o-tolyl)phosphine were added in a 30 ml microwave vial. The vial was sealed and purged with nitrogen. 10 mL of anhydrous chlorobenzene was added to the vial. The reaction mixture was heated at 80° C. for 10 min and at 140° C. for 1 h in a microwave reactor. After the reaction was completed, the solvent was removed and the title compound (1) was purified by column chromatography (eluent: hexane/$CHCl_3$=1/1).

Yield: 98%. $^1$H NMR (300 MHz, $CDCl_3$): δ 8.03 (dd, J=3.60 Hz, J=0.83 Hz, 2H), 7.78 (s, 2H), 7.41 (dd, J=5.07 Hz, J=0.87 Hz, 2H), 7.14 (dd, J=3.63 Hz, J=5.06 Hz, 2H). $^{13}$CNMR (75 MHz, $CDCl_3$): 152.76, 139.53, 128.43, 127.86, 127.31, 126.12, 126.07

5-Fluoro-4,7-di(thiophen-2-yl)-2,1,3-benzothiadiazole (2)

Yield: 95%. $^1$H NMR (300 MHz, $CDCl_3$): δ 8.22 (dd, J=3.9 Hz, J=0.9 Hz, 1H), δ 8.08 (dd, J=3.9 Hz, J=0.9 Hz, 1H), 7.78 (d, J=12.9, 1H), 7.51 (dd, J=5.1 Hz, J=1.2 Hz, 1H), 7.46 (dd, J=5.1 Hz, J=1.2 Hz, 1H), δ 7.19 (m, 2H).

5,6-Difluoro-4,7-di(thiophen-2-yl)-2,1,3-benzothiadiazole (3)

Yield: 95%. $^1$H NMR (300 MHz, $CDCl_3$): δ 8.33 (dd, J=3.60 Hz, J=0.83 Hz, 2H), 7.78 (s, 2H), 7.41 (dd, J=5.07 Hz, J=0.87 Hz, 2H), 7.14 (dd, J=3.63 Hz, J=5.06 Hz, 2H).

4,7-Bis(5-trimethylstannylthiophen-2-yl)-2,1,3-benzothiadiazole (M1)

Compound (1) was dissolved in anhydrous THF (20 ml) in a nitrogen-filled flask. The solution was cooled down to −78° C. LDA was prepared from the reaction of diisopropylamine (0.5 g, 5.1 mmol, 3 eq.) and n-BuLi (3.12 ml, 5.1 mmol, 3 eq.) (1.6 M hexane solution) in anhydrous THF (2 ml), which was added to the above solution dropwise. After stirring for 1 h, trimethylstannyl chloride (3.8 ml, 3.8 mmol, 2.3 eq.) (1 M THF solution) was added and reacted for 1 h. The reaction was quenched by addition of water and the organic layer was extracted with ether, washed with water and dried over anhydrous magnesium sulfate. After the solvent was removed under reduced pressure, the residue was purified by recrystallization from ethanol, giving the title compound as a needle-shaped purple crystal.

Yield: 90%. $^1$H NMR (300 MHz, $CDCl_3$): δ 8.17 (d, J=3.6 Hz, 2H,), 7.85 (s, 2H), 7.27 (d, J=3.6 Hz, 2H), 0.43 (s, 18H). $^{13}$C NMR (75 MHz, $CDCl_3$): 152.7, 145.1, 140.2, 136.1, 128.4, 125.9, 125.8, 8.15

4,7-Bis(5-trimethylstannylthiophen-2-yl)-5-fluoro-2,1,3-benzothiadiazole (M2)

Yield: 85%. $^1$H NMR (300 MHz, $CDCl_3$): δ 8.30 (d, J=3 Hz, 1H,), 8.19 (d, J=3.3, 1H), 7.79 (d, J=12.9 Hz, 1H), 7.32 (d, J=2.7 Hz, 1H), 7.29 (d, J=3.3 Hz, 1H), 0.43 (s, 18H).

4,7-Bis(5-trimethylstannylthiophen-2-yl)-5,6-difluoro-2,1,3-benzothiadiazole (M3)

Yield: 96%. $^1$H NMR (300 MHz, $CDCl_3$): δ 8.33 (d, J=3 Hz, 2H), 7.35 (d, J=3 Hz, 2H), 0.43 (s, 18H).

1,4-Dibromo-2,5-bis(2-hexyldecyl)benzene (M4)

2,5-Dibromo-benzene-1,4-diol (2 g, 7.5 mmol), 1-bromo-2-hexyldecane (5.7 g, 2.5 eq.), NaOH 50% (20 ml), toluene (20 mL), and tetrabutylammonium bromide were mixed in a flask. The mixture was stirred at 80° C. for 48 h. The reaction mixture was added to excess water and extracted with hexane 3-4 times. The organic layer was dried over anhydrous magnesium sulfate and concentrated. The concentrate was purified by column chromatography (hexane), giving the title compound as a colorless liquid.

Yield: 80%. $^1$H NMR (300 MHz, CDCl$_3$): δ 7.08 (s, 2H), 3.94 (d, J=5.7 Hz, 4H), 1.80 (m, 2H), 1.54-1.27 (br, 44H), 0.90 (m, 18H); $^{13}$C NMR (75 MHz, CDCl$_3$): 150.0, 118.0, 110.9, 72.8, 37.8, 31.9, 31.8, 31.2, 30.0, 29.6, 29.5, 29.3, 26.8, 26.7, 22.7, 14.1.

Synthesis of Polymers (PPDTBT, PPDTFBT, PPDT2FBT)

M1 (0.230 g, 0.32 mmol), M4 (0.263 g, 0.32 mmol), 2 mol % of tris(dibenzylideneacetone)dipalladium (0), and 8 mol % of tri(o-tolyl)phosphine were added in a 5 ml microwave vial, and then chlorobenzene (1 mL) was injected into the vial. The mixture was stirred at 80° C. for 10 min, at 100° C. for 10 min, and at 140° C. for 40 min in a microwave reactor. After completion of the reaction, the reaction mixture was injected with 2-(tributylstannyl)thiophene (0.1 eq.) and stirred at 140° C. for 20 min. After injection with 2-bromothiophene (0.2 eq.), stifling was continued at 140° C. for 20 min. After the reaction was finished, the reaction mixture was precipitated in a mixture of methanol (350 mL) and HCl (10 mL). The precipitated polymer was purified by Soxhlet extraction with acetone, hexane, and chloroform in this order. After removal of the solvents, the polymer in chloroform was precipitated in cold MeOH, filtered, and dried under vacuum. The other polymers were synthesized in accordance with the same procedure.

The polymers thus synthesized and chemical structures thereof are as follows. The mechanism of synthesis of the polymers is shown in FIG. 1.

PPDTBT:

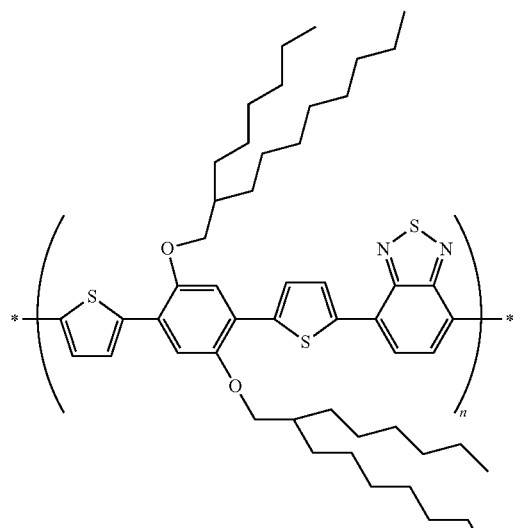

Poly[2,5-bis(2-hexyldecyl)phenylene-alt-[4,7-di(thiophen-2-yl)benzo[c][1,2,5]thiadiazole]]

PPDTFBT:

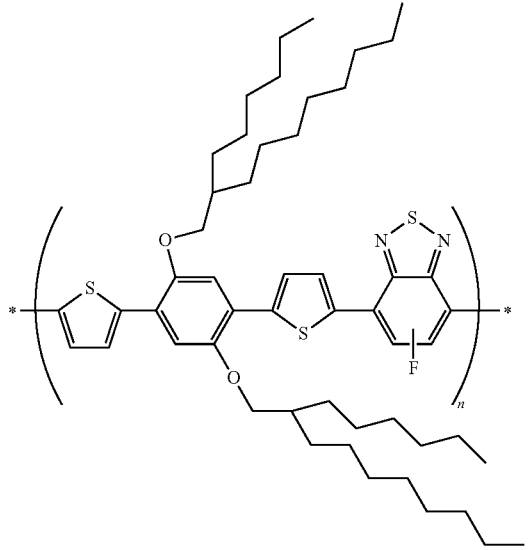

Poly[2,5-bis(2-hexyldecyl)phenylene-alt-[5-fluoro-4,7-di(thiophen-2-yl)benzo[c][1,2,5]thiadiazole]]

PPDT2FBT:

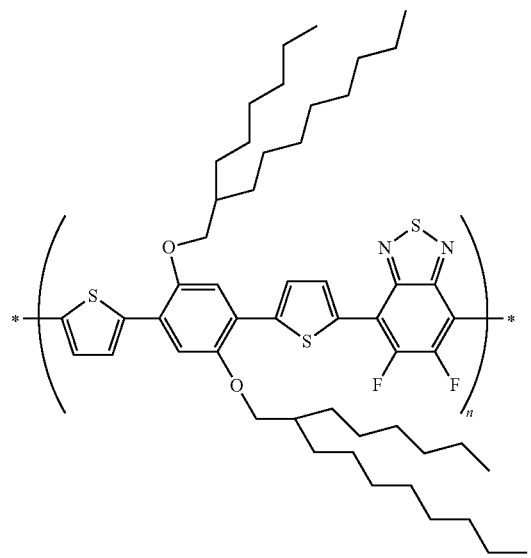

Poly[2,5-bis(2-hexyldecyl)phenylene-alt-[5,6-difluoro-4,7-di(thiophen-2-yl)benzo[c][1,2,5]thiadiazole]]

Figure 2:
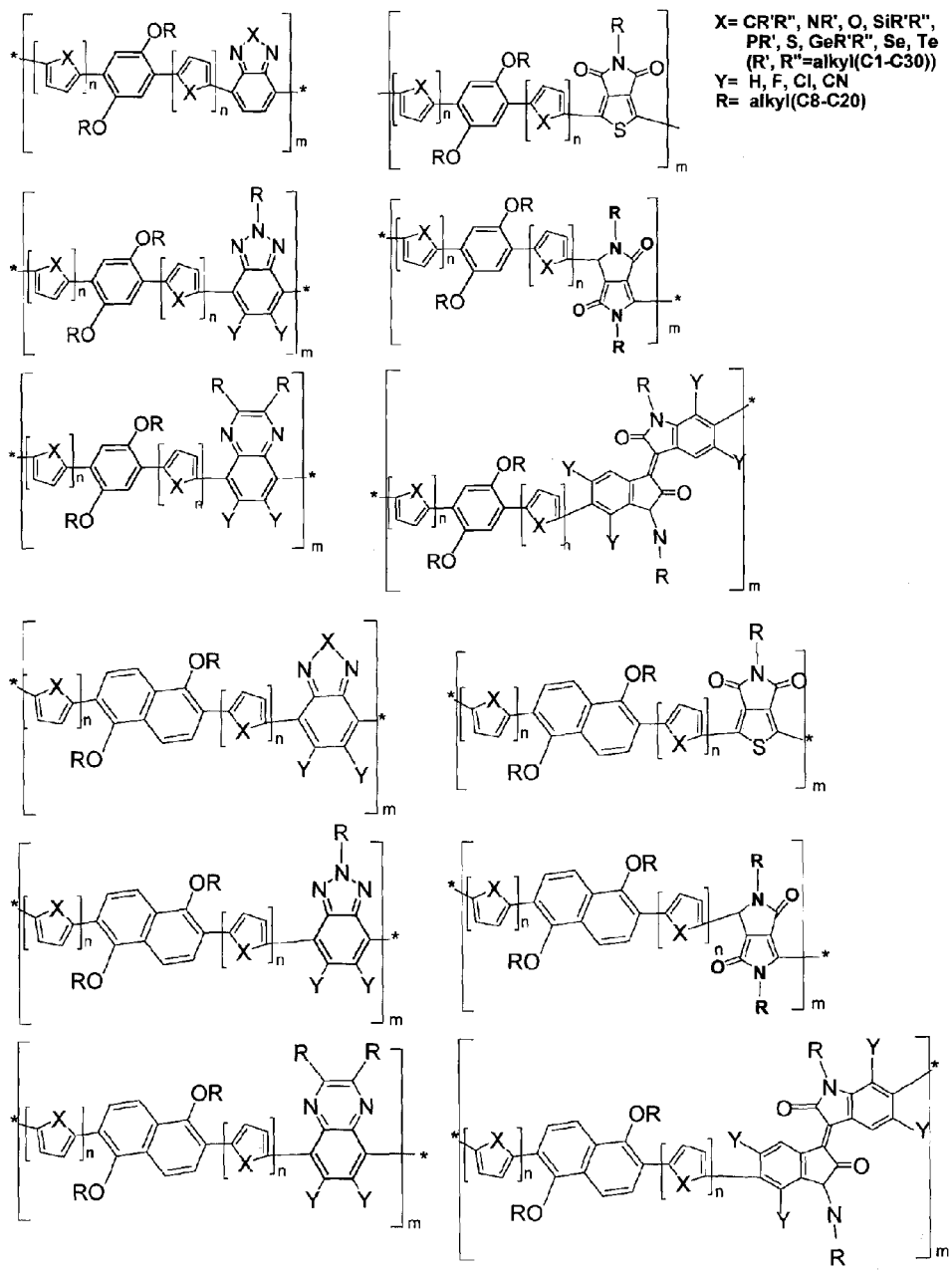
FIG. 2 shows polymers according to exemplary embodiments of the present invention.

Following the above method, similar polymers having the structures shown in FIG. 2 can be synthesized. It is expected that these polymers will work efficiently in solar cells.

<Result Analysis>

Theoretical Calculations

First, theoretical calculations were performed to determine the influence of F element on the synthesized polymers. The polymers are soluble in general organic solvents (such as chloroform and chlorobenzene) because the dialkoxyphenylene moieties as electron donating groups have 2-hexyldecyl groups.

Figure 3:
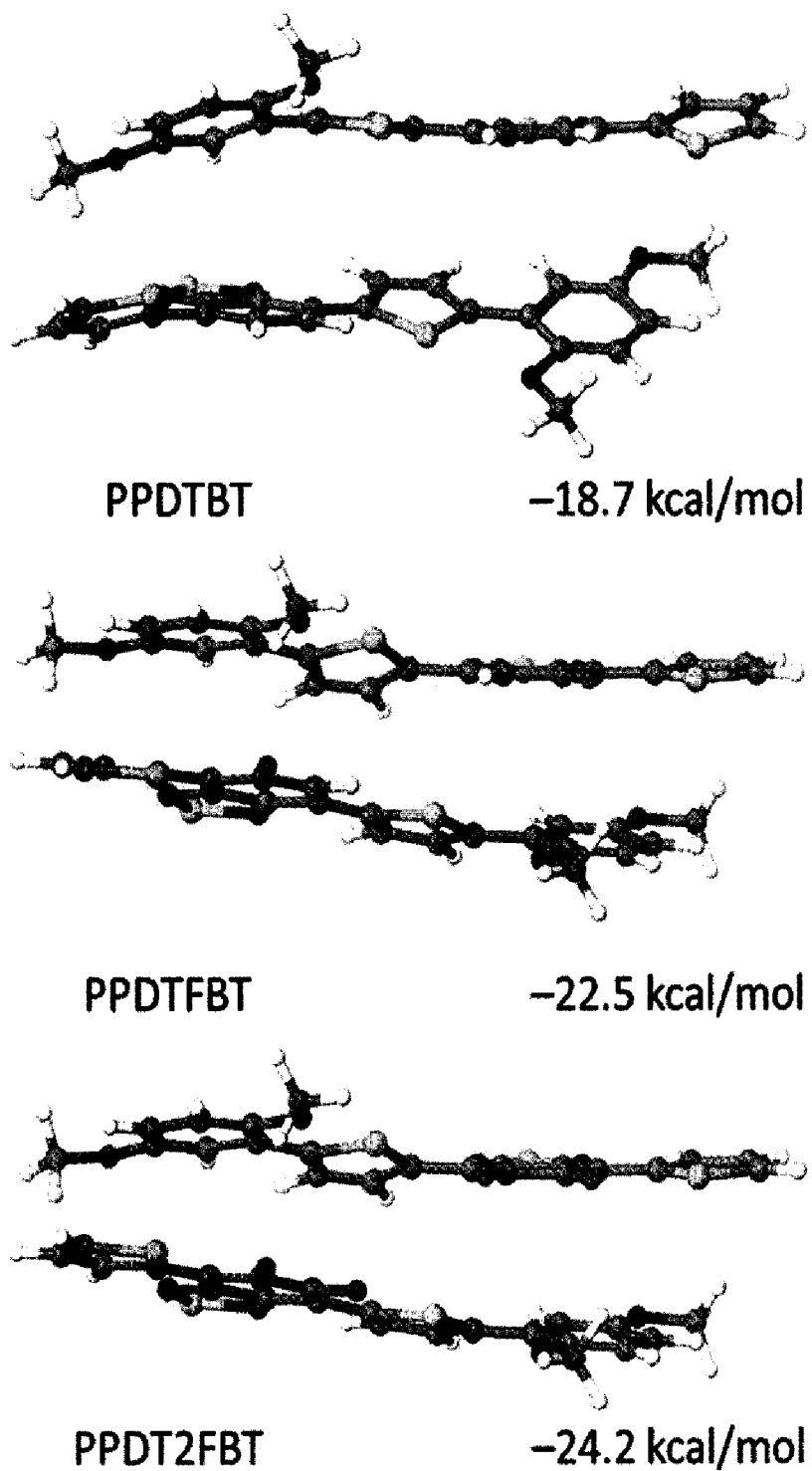
FIG. 3 shows the intermolecular packing structures of polymer derivatives prepared in Synthesis Example 2, which were calculated based on density functional theory.

The influence of alkoxy substitution on the phenylene moiety and F substitution on the benzothiadiazole moiety was investigated using computational calculations based on density functional theory (DFT). The calculation results revealed that the introduction of alkoxy on the phenylene moiety minimized any undesired steric hindrance compared to the introduction of alkyl groups and showed a dihedral angle of ~19.4° (alkyl groups: 54.1°). Specifically, the F substitution on the benzothiadiazole moiety showed a dihedral angle corresponding to ~0°. F element seems to have no significant influence on the steric hindrance compared to H element. The molecular packing energies of the repeating units of the three polymers were calculated to determine whether the introduction of F element has a great influence on the molecular packing. As a result, the head-to-tail configuration was found to be the most stable and PPDT2FBT was found to be the most structurally stable. These results appear to be due to the nonbonding interactions of F and S between the neighboring molecules (FIG. 3).

Figure 4A:
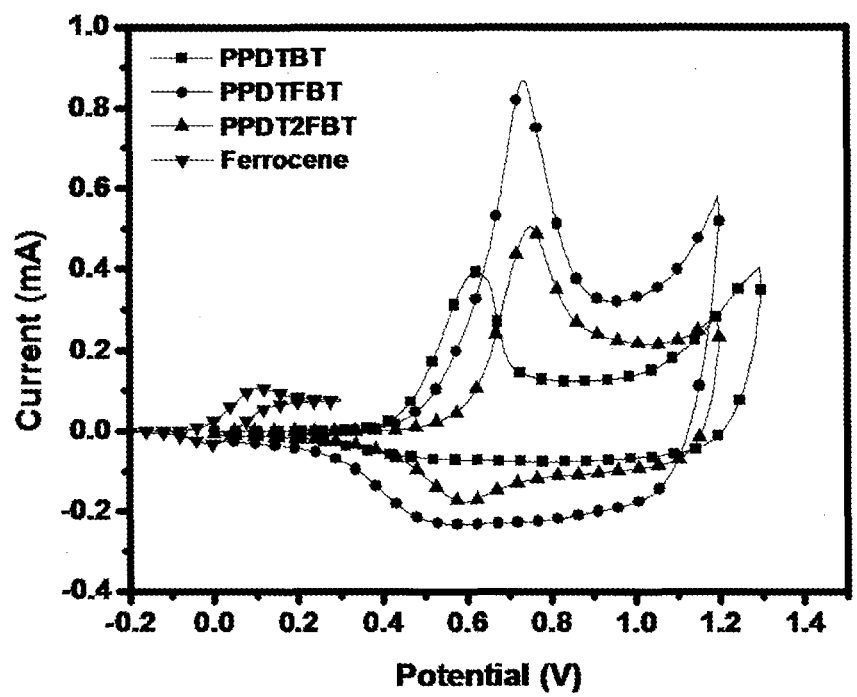
FIG. 4 shows cyclic voltammograms and UV-Vis absorption spectra of PPDTBT, PPDTFBT, and PPDT2FBT prepared in Synthesis Example 2: (a) oxidation potentials (ferrocene/ferrocenium standard, −4.8 eV) in chloroform solutions; (b) in chloroform solutions; (c) in films.

HOMO energy levels of −4.98, −5.07, and −5.09 eV and LUMO energy levels of −2.49, −2.56, and −2.60 eV were calculated for PPDTBT, PPDTFBT, and PPDT2FBT, respectively. It was calculated that the HOMO levels of the polymers were distributed throughout the molecules and the LUMO levels were localized to the benzothiadiazole moieties as the electron accepting groups. These results showed a tendency similar to the measurement results of cyclic voltammetry (CV) (FIG. 4a).

Characteristics of the Polymers

The characteristics of the polymers synthesized in Synthesis Example 2 were investigated and the results are summarized in Table 1.

TABLE 1

|  | $M_n$/PDI[a] [kg/mol] | $\lambda_{onset}$ (film) [nm] | $E^{opt}g$ [eV] | HOMO (CV) [eV] | LUMO[b] [eV] | Td[c] | Tc[d] | Tm[e] |
|---|---|---|---|---|---|---|---|---|
| PPDTBT | 36/1.47 | 720 | 1.72 | −5.29 | −3.57 | 396 | 239 | 257 |
| PPDTFBT | 20/2.11 | 720 | 1.72 | −5.35 | −3.63 | 397 | 276 | 283 |
| PPDT2FBT | 90/1.38 | 705 | 1.76 | −5.45 | −3.69 | 402 | 308 | 317 |

([a]$M_n$ = Number average molecular weight, [b]LUMO = HOMO + $E^{opt}g$ (optical band gap), [c]$T_d$ = Decomposition temperature, [d]$T_c$ = Crystallization temperature, [e]$T_m$ = Melting point Electrochemical Properties FIG. 4a shows cyclic voltammograms of the polymers (ferrocene/ferrocenium standard, −4.8 eV). Referring to the results summarized in Table 1, the introduction of F on the benzothiadiazole moiety decreased the HOMO and LUMO energy levels of the polymers. The decreased HOMO energy levels are expected to increase the stability of the polymers in air and improve the open-circuit voltage characteristics of devices.

However, no reduction of the polymers was observed. The LUMO energy levels of the polymers were calculated from the HOMO energy levels and the optical band gaps.

Optical Properties

Figure 4B:
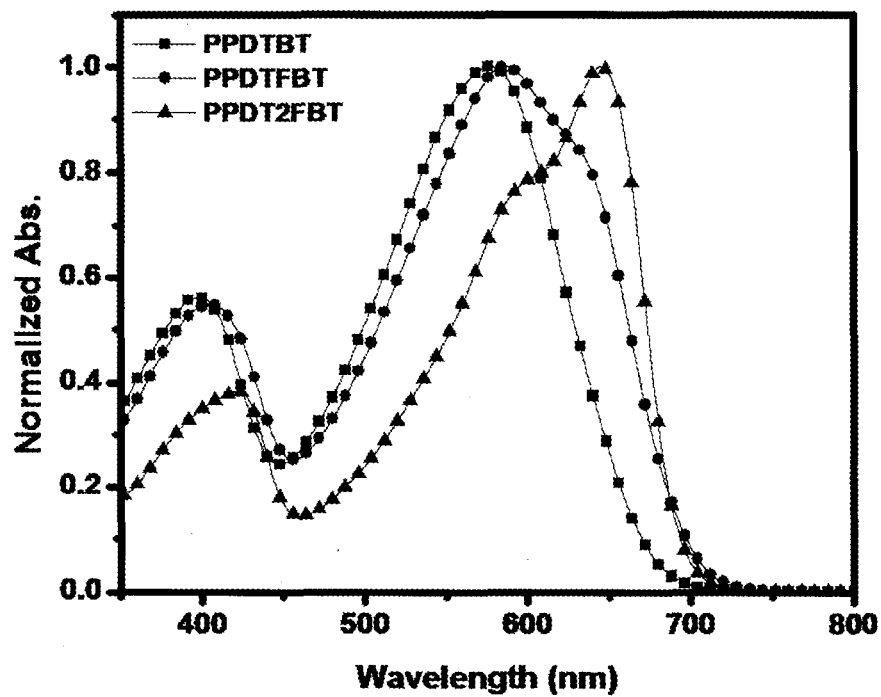
Figure 4C:
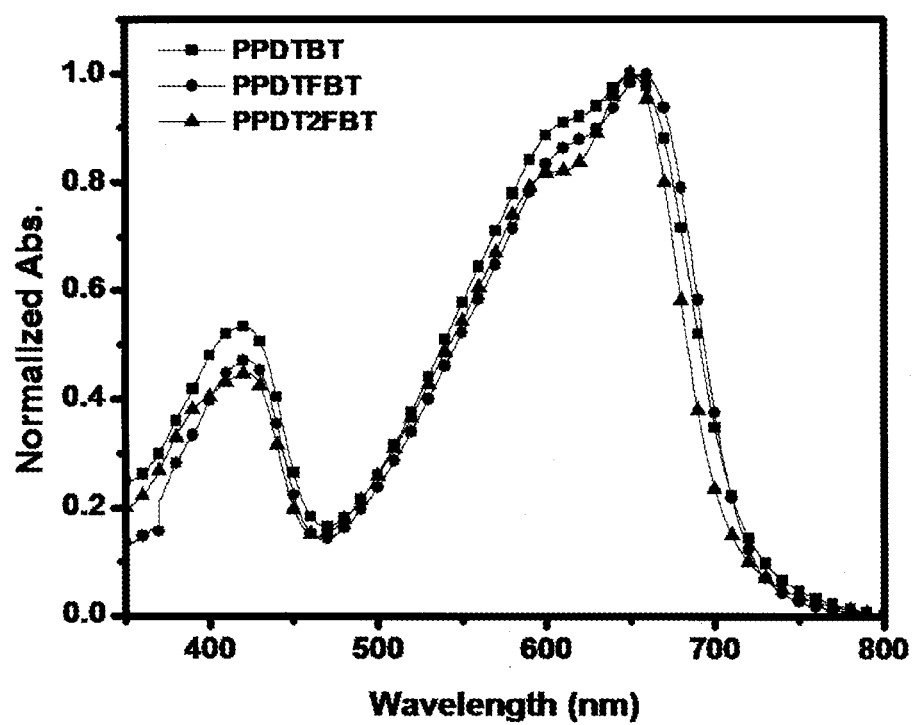

FIGS. 4b and 4c show UV absorption spectra of the polymers synthesized in Synthesis Example 2 in chloroform solutions and in films, respectively.

Figure 5A:
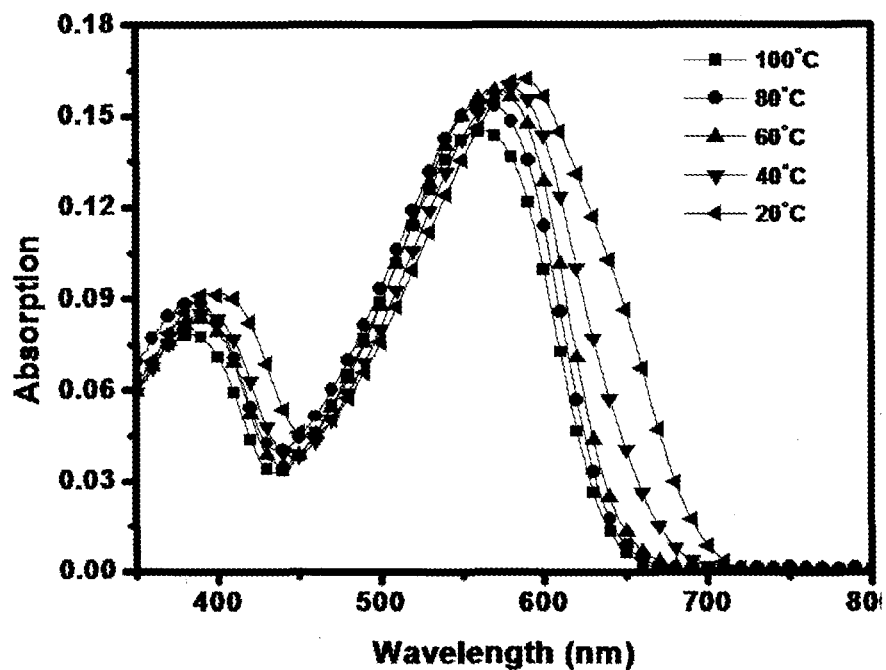
FIG. 5 shows UV-Vis absorption spectra of (a) PPDTFBT and (b) PPDT2FBT in chlorobenzene solutions (5 μM) at different temperatures.
Figure 5B:
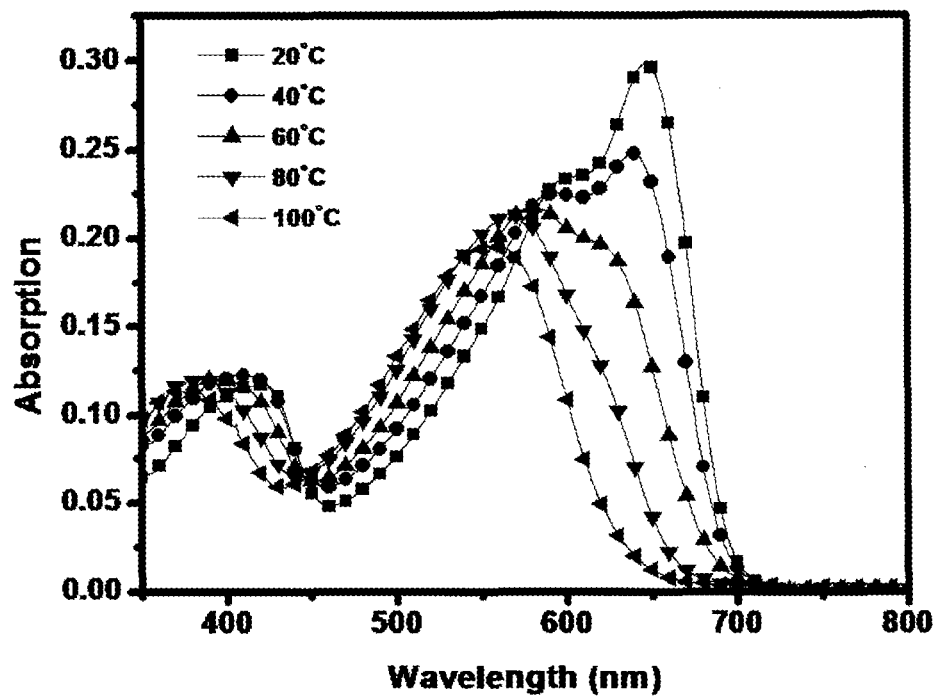

FIG. 5 shows UV-Vis absorption spectra of (a) PPDTFBT and (b) PPDT2FBT in chlorobenzene solutions at different temperatures.

Referring to FIGS. 4b and 4c, the polymers had broad optical absorption bands in the range of 350-750 nm. The absorption wavelengths can be divided into short-wavelength absorption corresponding to π-π* transition and long-wavelength absorption attributed to intramolecular charge transfer. The absorption spectra of the fluorinated polymers were red-shifted compared to those of the non-fluorinated polymer. Shoulder peaks attributed to the interactions between the polymer molecules were observed. These results are in agreement with the results of the theoretical calculations. The shoulder peaks attributed to the intermolecular interactions were confirmed by the decreasing intensity of the peaks with increasing temperature, as shown in FIG. 5. The absorption spectra of the polymers in films (FIG. 4c) show that the shoulder peak was enhanced with increasing fluorine substitution, which is believed to be due to the improved intermolecular interactions by the introduction of F.

Thermal Properties

FIG. 6 shows thermogravimetric analysis (TGA) and differential scanning calorimetry (DSC) curves of the synthesized polymers.

Figure 6A:
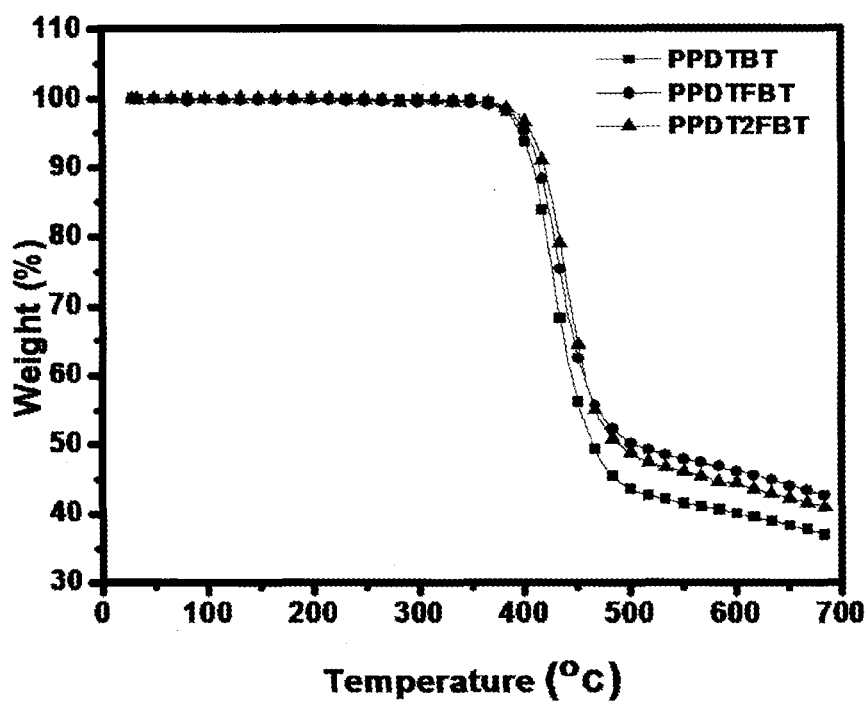
FIG. 6 shows (a) thermogravimetric analysis (TGA) curves and (b) differential scanning calorimetry (DSC) curves of PPDTBT, PPDTFBT, and PPDT2FBT prepared in Synthesis Example 2.

Referring first to FIG. 6a, the thermal stability of the polymers can be confirmed by TGA analysis. PPDTBT, PPDTFBT, and PPDT2FBT showed increasing decomposition temperatures of 396° C., 397° C., and 402° C., respectively. These results lead to the conclusion that the polymers have high thermal stability.

Figure 6B:
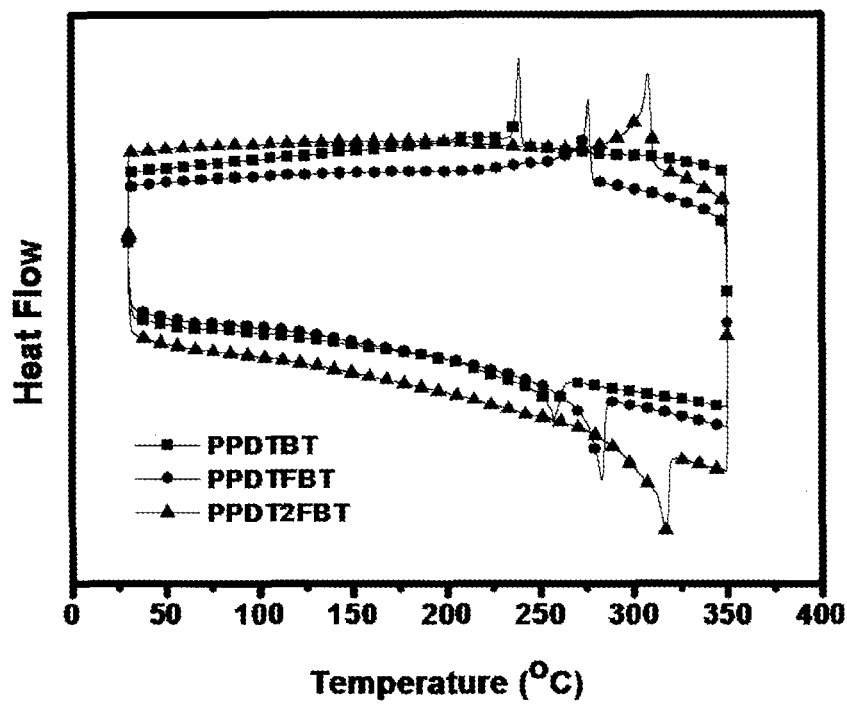

Referring to FIG. 6b, the DSC results reveal that melting points at 257, 283 and 317° C., and recrystallization temperatures at 239, 276 and 308° C. were measured for PPDTBT, PPDTFBT and PPDT2FBT, respectively. These results indicate that the introduction of F element has a significant effect on the crystallinity of the polymers.

TEST EXAMPLE 1

Fabrication and Analysis of Organic Solar Cell Devices

Figure 7A:
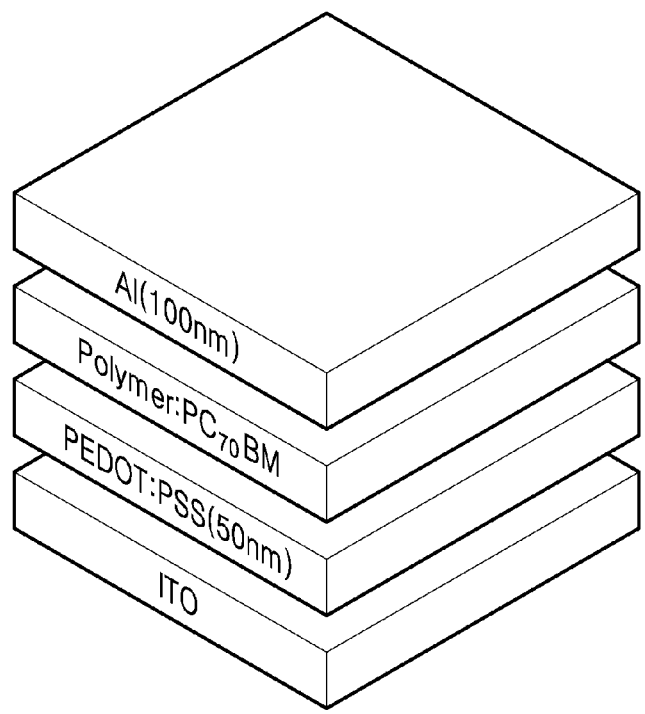
FIG. 7 shows (a) the structure and (b) energy-band diagram of a conventional-type organic thin-film solar cell device.
Figure 7B:
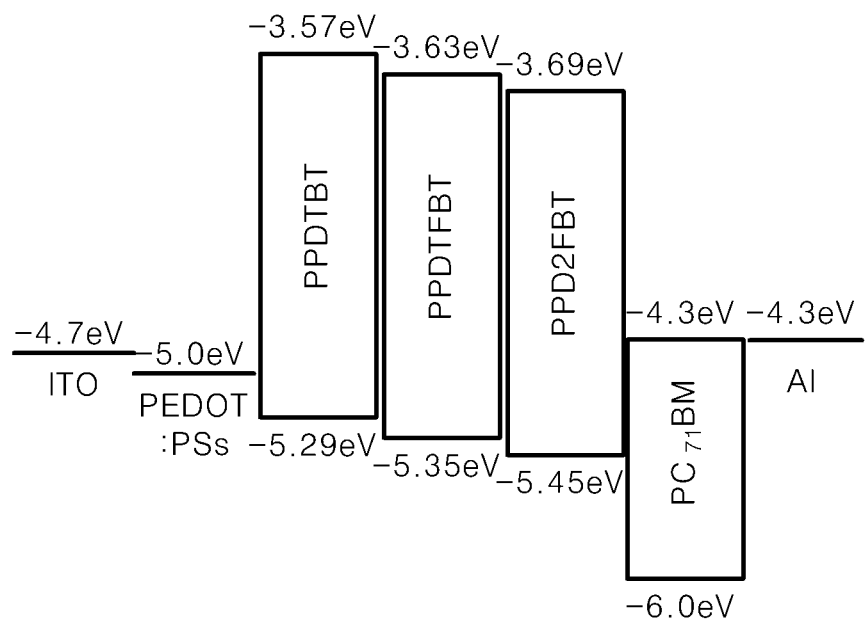

A conventional-type bulk heterojunction organic solar cell device was fabricated using the polymer PPDTBT, PPDTFBT or PPDT2FBT prepared in Synthesis Example 2 as an electron donor and $PC_{70}BM$ (Test Example 1-1) or $PC_{71}BM$ (Test Examples 1-2 and 1-3) as an electron acceptor in accordance with a suitable method known in the art. The organic solar cell device is shown in FIGS. 7a and 7b.

More specifically, the method includes the following steps.

(1) A pre-cleaned ITO transparent electrode was treated with UV ozone for 10 min, spin coated with poly(3,4-ethylenedioxythiophene)/polystyrenesulfonic acid (PEDOT:PSS) (CLEVIOS, Heraeus), and dried at 130-140° C. for about 10 min to form an about 40 nm thick PEDOT:PSS layer.

(2) 1 wt % of each of the polymers PPDTBT, PPDTFBT, and PPDT2FBT and 1.5 wt % of $PC_{71}BM$ were dissolved in a solvent. The blend solution was spin-coated on top of the PEDOT:PSS layer to form an about 100-400 nm thick sunlight-absorbing organic semiconductor layer.

(3) The resulting structure was placed in a thermal evaporator and aluminum (Al) as a metal electrode was deposited to a thickness of about 100 nm on the sunlight-absorbing layer, achieving the fabrication of the organic thin-film solar cell device.

TEST EXAMPLE 1-1

Analysis of Crystallinities of the Polymers and the Organic Thin Films with and without Additive The crystallinities of the blend thin films of the polymers synthesized in Synthesis Example 2 and $PC_{70}BM$ with and without diphenyl ether were analyzed by TEM and 2D-GIXRD. The results are shown in FIGS. 8 and 9 and Table 2.

TABLE 2

| Films | Polymers | Additive (DPE) | Lamellar spacing q (Å$^{-1}$) | Lamellar spacing d-spacing (Å) | π-π stack (q$_z$ direction) q (Å$^{-1}$) | π-π stack (q$_z$ direction) d-spacing (Å) |
|---|---|---|---|---|---|---|
| Pristine polymer | PPDTBT | X | 0.3324 | 18.9 | — | — |
|  |  | ○ | 0.3312 | 19.0 | — | — |
|  | PPDTFBT | X | 0.3035 | 20.7 | 1.6614 | 3.78 |
|  |  | ○ | 0.3036 | 20.7 | 1.6706 | 3.76 |
|  | PPDT2FBT | X | 0.3036 | 20.7 | 1.6873 | 3.72 |
|  |  | ○ | 0.3000 | 20.9 | 1.6901 | 3.72 |
| Polymer:PC$_{70}$BM blend | PPDTBT | X | 0.3297 | 19.1 | — | — |
|  |  | ○ | 0.3332 | 18.9 | — | — |
|  | PPDTFBT | X | 0.3182 | 19.7 | 1.6925 | 3.71 |
|  |  | ○ | 0.3178 | 19.8 | 1.7590 | 3.57 |
|  | PPDT2FBT | X | 0.3164 | 19.9 | 1.7089 | 3.68 |
|  |  | ○ | 0.3133 | 20.1 | 1.7514 | 3.59 |

Figure 8:
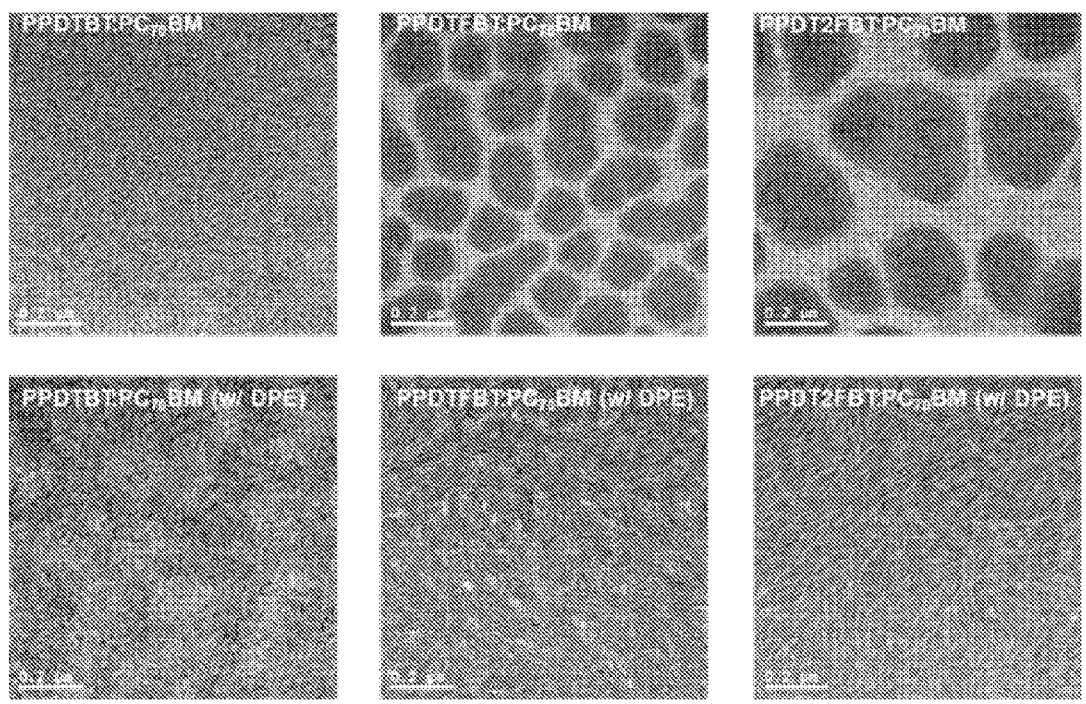
FIG. 8 shows TEM images of blend thin films of polymers prepared in Synthesis Example 2 and $PC_{70}BM$.
Figure 9A:
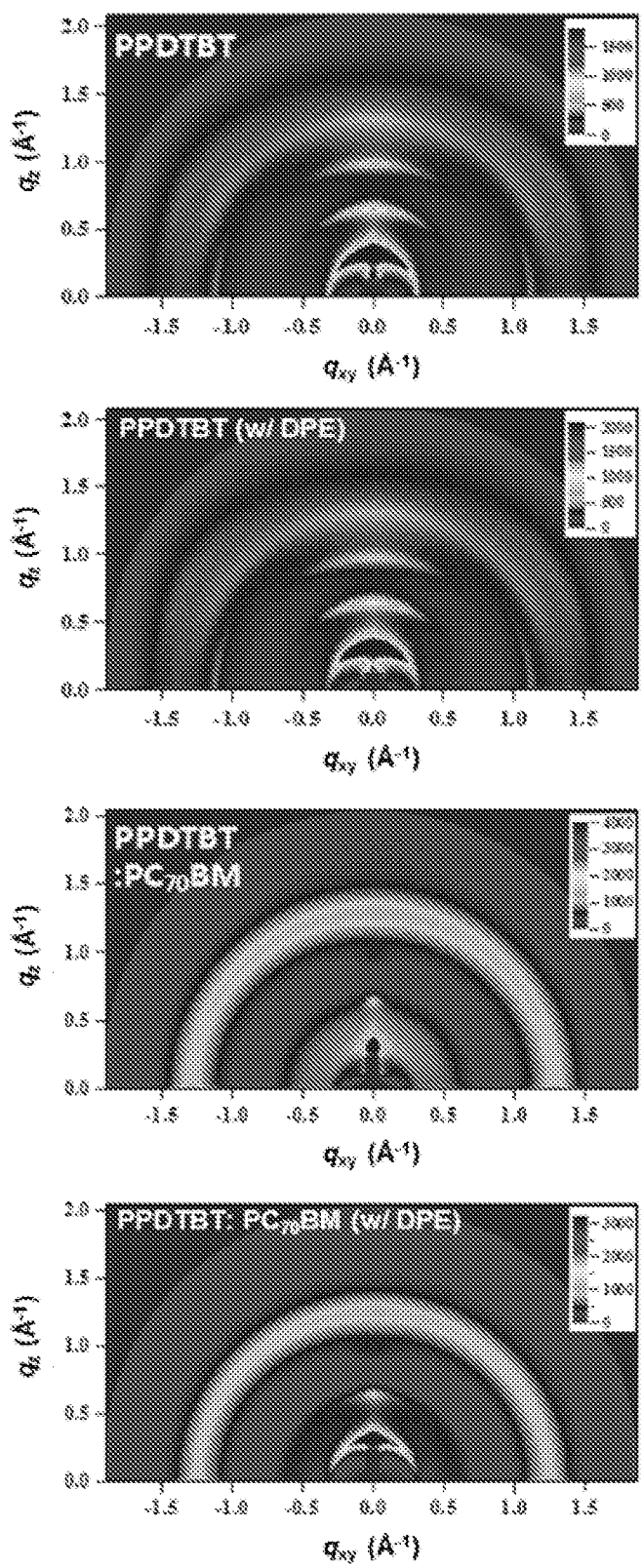
FIG. 9 shows the results of 2D-GIXRD analysis for blend thin films of polymers prepared in Synthesis Example 2 and $PC_{70}BM$.
Figure 9B:
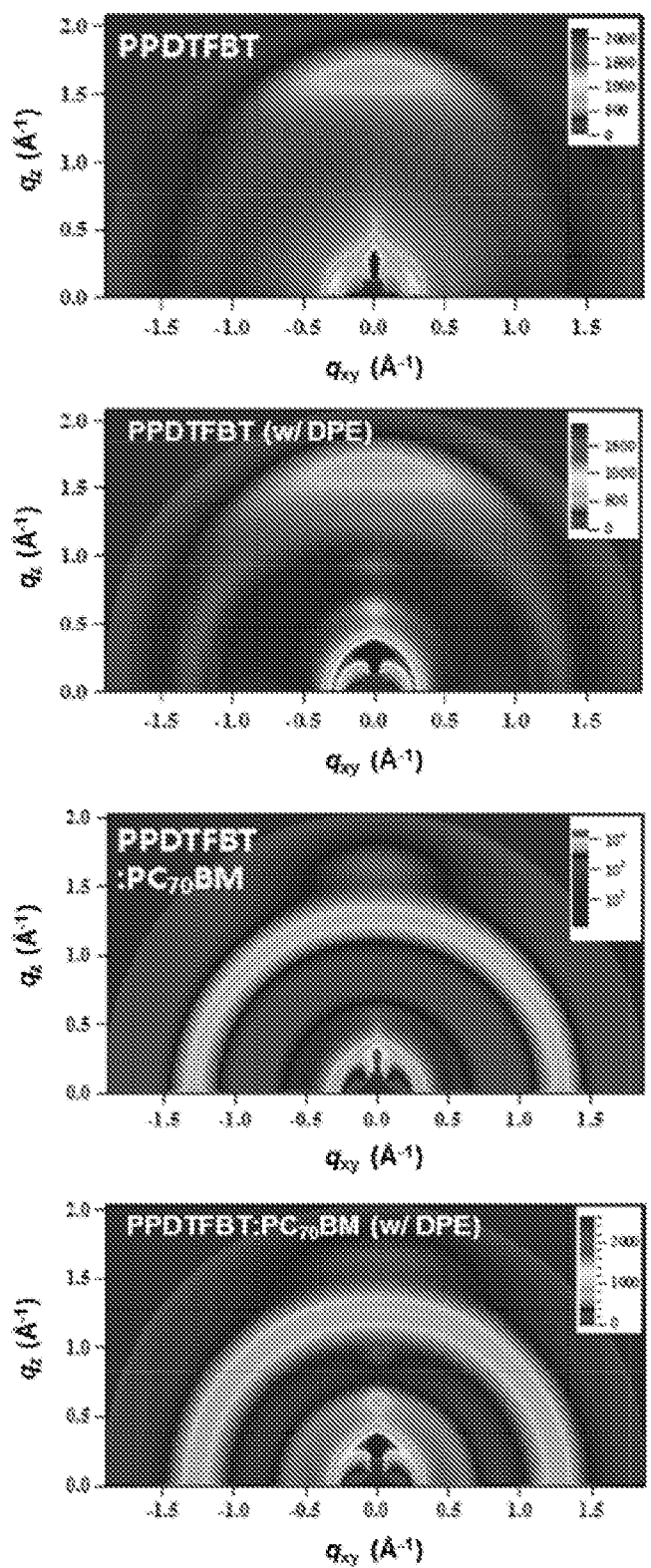
Figure 9C:
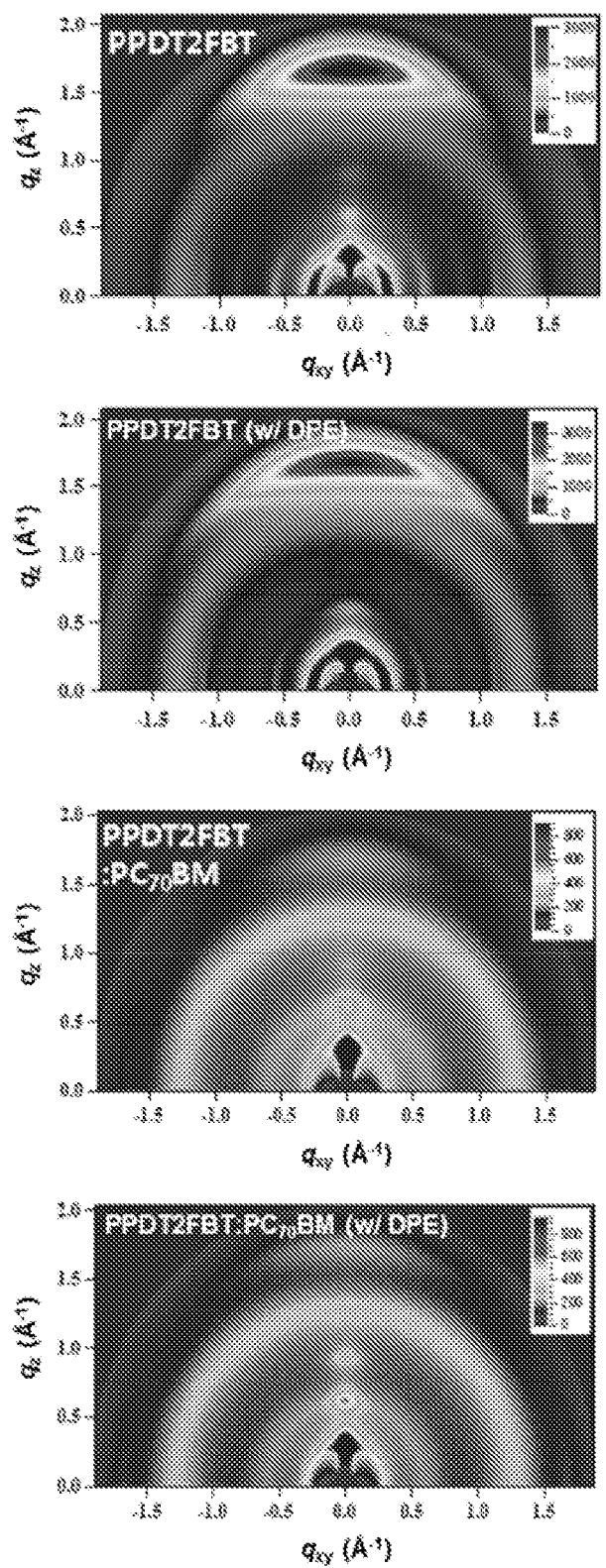

FIG. 8 shows TEM images of the polymer:PC$_{70}$BM organic thin films. Referring to FIG. 8, the addition of diphenyl ether allowed the organic thin films to have more dense structures.

The 2D-GIXRD results (FIG. 9 and Table 2) reveal the orientations of the polymers and the polymer:PC$_{70}$BM organic thin films.

Referring specifically to FIG. 9, (100), (200), and (300) peaks attributed to the lamellar orientation in the q$_z$ axis were observed in the non-fluorinated polymer thin films (9a). For the fluorinated polymers (9b, 9c), peaks attributed to the π-π stacking in the q$_z$ axis were increased and the stacking distance was reduced (PPDTFBT: 3.78 Å PPDT2FBT: 3.72 Å) with increasing F substitution.

The polymer:PC$_{70}$BM blend thin films showed a tendency similar to the pristine polymer thin films. This is because the crystallinities of the polymers attributed to the noncovalent bonding interactions were not greatly affected when PC$_{70}$BM was blended with the polymers. Stronger peaks were observed when diphenyl ether as an additive was included in the polymers and the polymer:PC$_{70}$BM organic thin films.

FIG. 9 shows face-on orientations. The face-on orientation is an indicative of efficient charge transfer and harvesting properties because the polymers are arranged parallel to the solar cell device configuration. From these observations, it can be confirmed that more dense orientations of the polymers corresponding to the face-on orientations are induced with increasing F substitution.

TEST EXAMPLE 1-2

Characteristics of Organic Thin-Film Solar Cell Devices Using Different Solvents with and without Thermal Annealing In this test example, the influences of solvents and thermal annealing on devices were investigated. Organic thin-film solar cell devices were fabricated using dichlorobenzene and chlorobenzene as solvents without the addition of an additive and their characteristics were compared. The characteristics of the devices are summarized in Table 3.

TABLE 3

|  | Solvent | Thermal annealing[a] | J$_{sc}$ (mA/cm$^2$) | V$_{oc}$ (V) | FF | PCE (%) | J$_{sc}$ [Cal.] (mA/cm$^2$) |
|---|---|---|---|---|---|---|---|
| PPDTBT | DCB | X | 9.77 | 0.76 | 0.58 | 4.27 | — |
|  |  | ○ | 10.40 | 0.81 | 0.61 | 5.08 | 10.53 |
|  | CB | X | 10.40 | 0.74 | 0.54 | 4.13 | — |
|  |  | ○ | 10.30 | 0.80 | 0.61 | 5.02 | 10.75 |
| PPDTFBT | DCB | X | 10.6 | 0.76 | 0.59 | 4.72 | 10.33 |
|  |  | ○ | 10.2 | 0.81 | 0.62 | 5.11 | — |
|  | CB | X | 8.14 | 0.76 | 0.55 | 3.36 | 8.71 |
|  |  | ○ | 6.87 | 0.82 | 0.64 | 3.58 | — |
| PPDT2FBT | DCB | X | 12.9 | 0.78 | 0.71 | 7.18 | 12.73 |
|  |  | ○ | 11.40 | 0.86 | 0.74 | 7.26 | — |
|  | CB | X | 6.46 | 0.81 | 0.61 | 3.22 | 6.84 |
|  |  | ○ | 5.08 | 0.86 | 0.64 | 2.78 | — |

([a]Thermal annealing at 130° C. for 10 min)

Figure 10A:
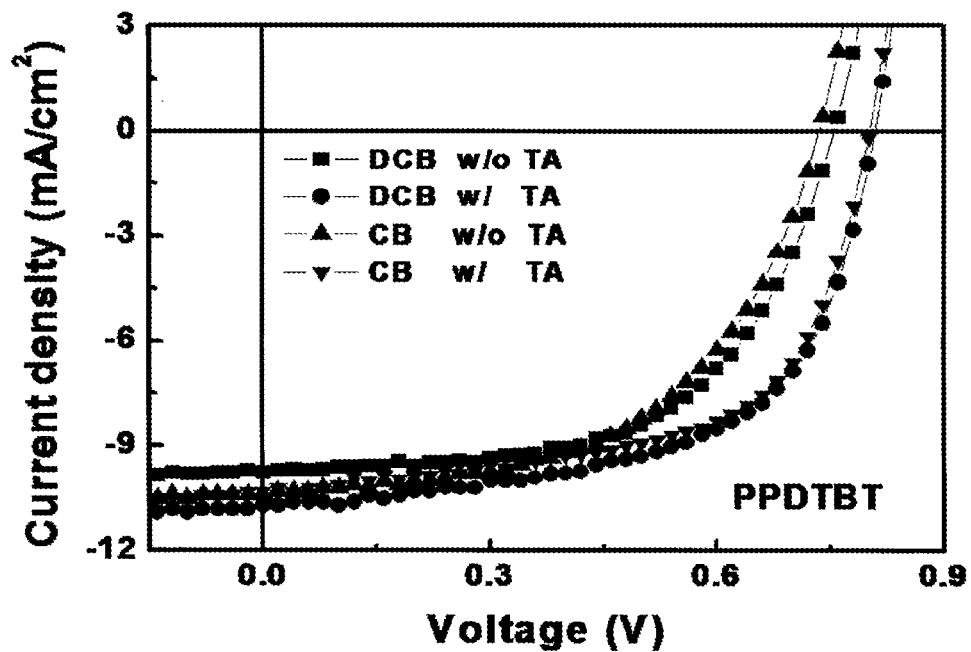
FIG. 10 shows voltage-current density curves for (a) PPDTBT, (b) PPDTFBT, and (c) PPDT2FBT when different solvents were used with and without annealing.
Figure 10B:
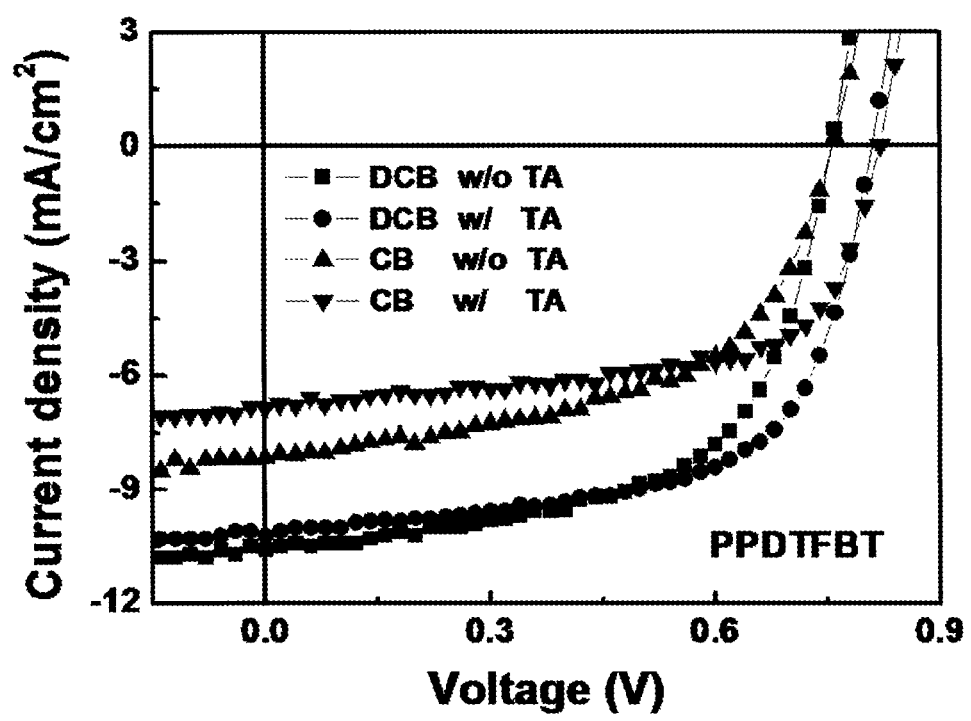
Figure 10C:
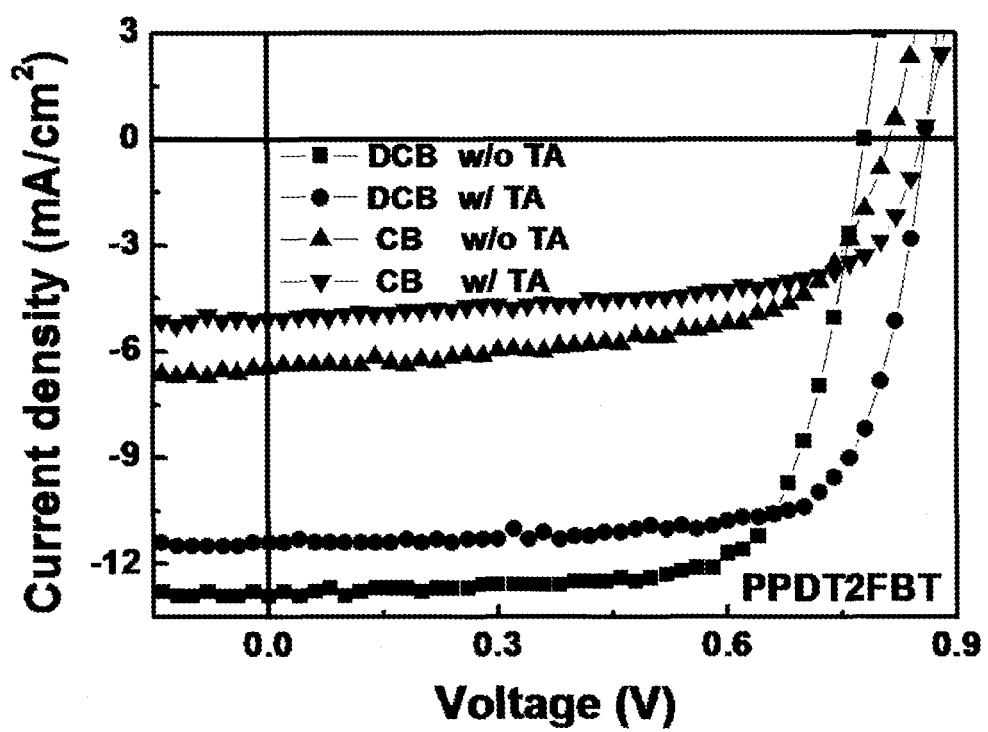

FIG. 10 shows voltage-current density curves for the polymers.

Referring to the results in Table 3, the non-fluorinated polymer PPDTBT showed the lowest open-circuit voltages and the fluorinated polymers PPDTFBT and PPDT2FBT showed increasing open-circuit voltages with increasing number of F atoms. These results are due to the different HOMO energy levels of the polymers.

For PPDTBT, power conversion efficiencies (PCE) and thermal annealing effects when dichlorobenzene (DCB) was used as a solvent were similar to those when chlorobenzene (CB) was used. In contrast, different power conversion efficiencies were obtained for the fluorinated polymers PPDTFBT and PPDT2FBT. Specifically, when dichlorobenzene was used, power conversion efficiencies of 4.72 and 7.18% were obtained for PPDTFBT and PPDT2FBT, respectively. The power conversion efficiencies were significantly reduced to 3.36 and 3.22%, respectively, when chlorobenzene was used.

Noticeable results are shown in Table 3. Referring to FIG. 3, thermal annealing increased the open-circuit voltages of the polymers. This indicates that the open-circuit voltages determined by the HOMO energy levels of the polymers and the LUMO energy levels of PCBM are correlated with the HOMO levels of the corresponding polymers.

In contrast, increases or decreases in the power conversion efficiency of the devices using dichlorobenzene as a solvent after thermal annealing were different from those of the devices using chlorobenzene as a solvent. Particularly, for PPDT2FBT, the use of chlorobenzene as a solvent brought about a sharp decrease in efficiency after thermal annealing.

TEST EXAMPLE 1-3

Characteristics of Organic Thin-Film Solar Cell Devices Using Different Solvents with and without Additives In this test example, organic thin-film solar cell devices were fabricated using small amounts of additives and their characteristics were compared in terms of efficiency optimization. Specifically, about 2% each of octanedithiol (ODT), diiodooctane (DIO), chloronaphthalene (CN), and diphenyl ether (DPE) was added to an active solution and the mixture was used to fabricate an organic thin-film solar cell device. The device using diphenyl ether (DPE) was found to have the highest efficiency. The characteristics of the devices using different solvents with and without DPE were compared. The results are summarized in Table 4.

TABLE 4

|  | Solvent | Additive (DPE) | $J_{sc}$ (mA/cm$^2$) | $V_{oc}$ (V) | FF | PCE (%) | Jsc [Cal.] (mA/cm$^2$) |
|---|---|---|---|---|---|---|---|
| PPDTBT | DCB | X | 9.77 | 0.76 | 0.58 | 4.27 | — |
|  |  | ○ | 11.79 | 0.73 | 0.61 | 5.25 | 11.83 |
|  | CB | X | 10.40 | 0.74 | 0.54 | 4.13 | — |
|  |  | ○ | 11.73 | 0.70 | 0.63 | 5.17 | 11.77 |
| PPDTFBT | DCB | X | 10.60 | 0.76 | 0.59 | 4.72 | 10.33 |
|  |  | ○ | 13.88 | 0.73 | 0.69 | 7.03 | — |
|  | CB | X | 8.14 | 0.76 | 0.55 | 3.36 | 8.71 |
|  |  | ○ | 13.29 | 0.73 | 0.69 | 6.64 | 12.88 |
| PPDT2FBT | DCB | X | 12.90 | 0.78 | 0.71 | 7.18 | 12.73 |
|  |  | ○ | 14.09 | 0.75 | 0.70 | 7.41 | — |
| CB | X | 6.46 | 0.81 | 0.61 | 3.22 | 6.84 |
|  | ○ | 15.73 | 0.78 | 0.71 | 8.64 | 15.59 |

Figure 11A:
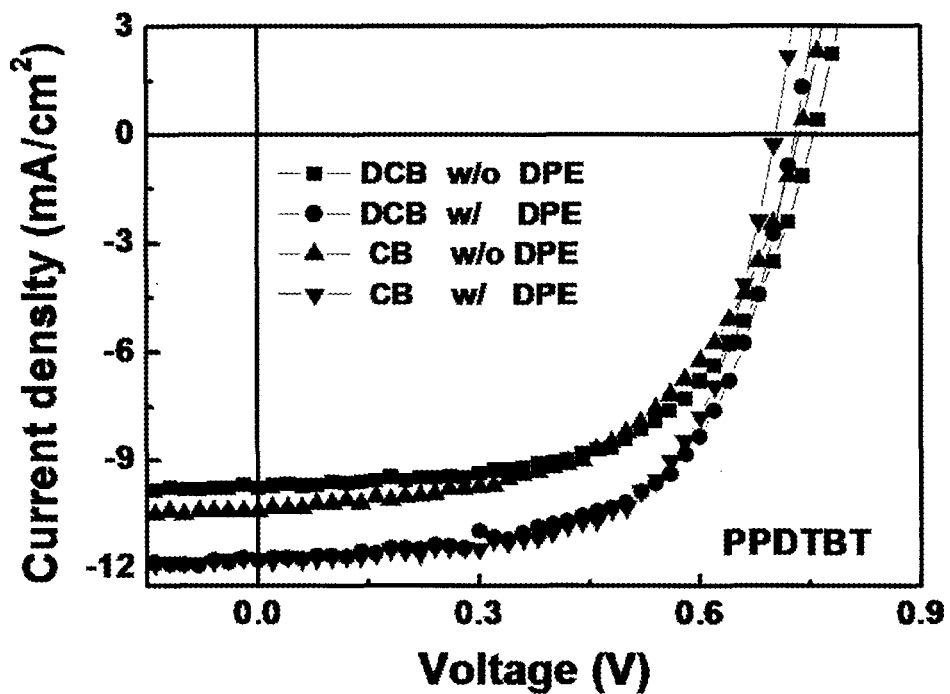
FIG. 11 shows voltage-current density curves for (a) PPDTBT, (b) PPDTFBT, and (c) PPDT2FBT when different solvents were used with and without an additive.
Figure 11B:
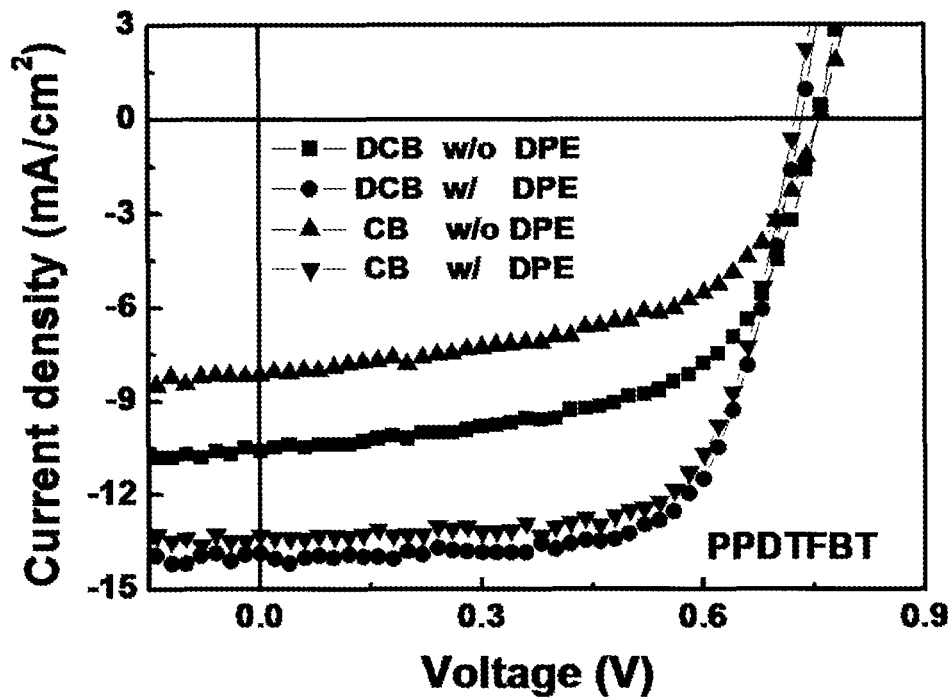
Figure 11C:
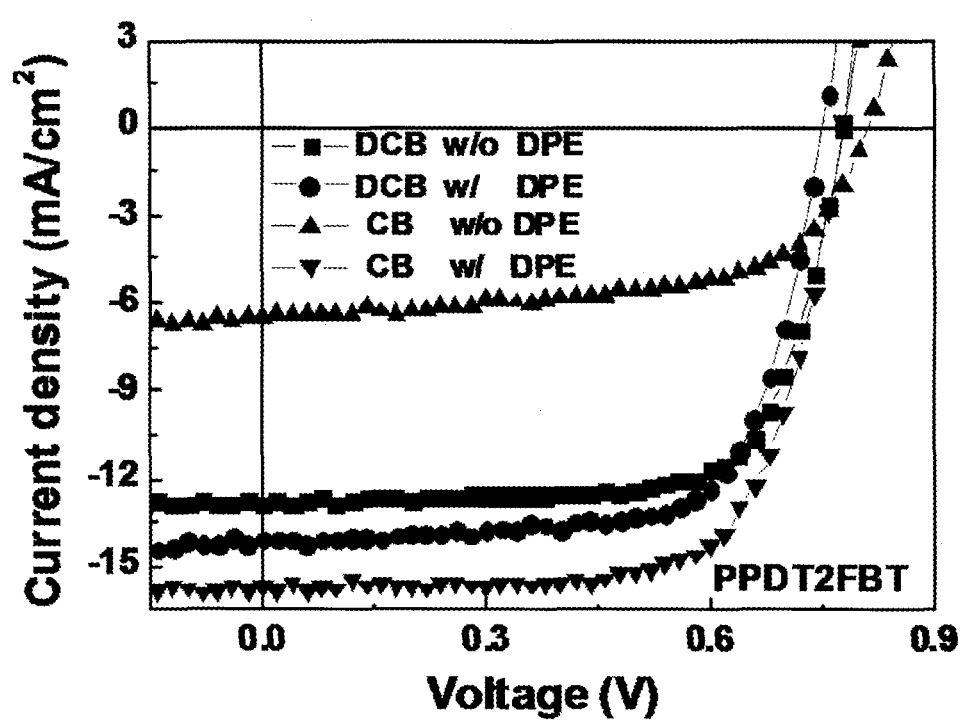

FIG. 11 shows voltage-current density curves for the polymers.

Referring to the results in Table 4, for PPDTBT, the power conversion efficiency of the device using dichlorobenzene with the additive increased from 4.27% to 5.25% and that of the device using dichlorobenzene with the additive increased from 4.13% to 5.17%. The increments were not significant and the influence of the solvents was also insignificant.

When dichlorobenzene was used, the power conversion efficiency increased from 4.72% to 7.03% (for PPDTFBT) and from 7.18% to 7.41% (for PPDT2FBT). The power conversion efficiencies were high and the increments were not significant.

In contrast, when chlorobenzene was used as a solvent, the power conversion efficiency increased significantly from 3.36% to 6.64% (for PPDTFBT) and from 3.22% to 8.64% (for PPDT2FBT).

These results indicate that the reaction profile of the additive varied depending on the kind of the solvent, resulting in different efficiencies of the organic thin-film solar cell devices.

Result Analysis

Figure 12A:
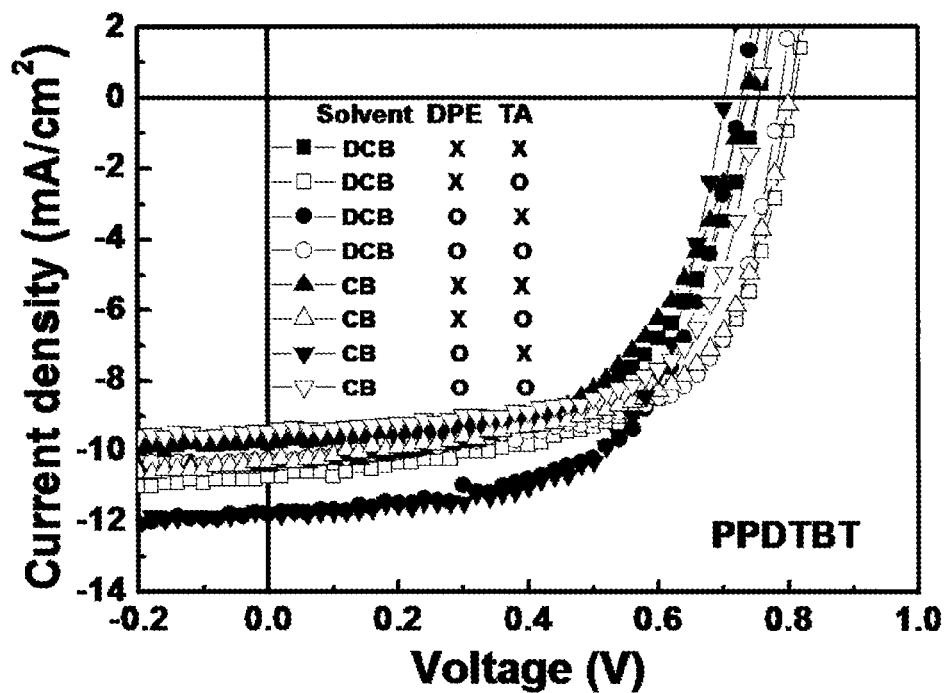
FIG. 12 shows (a) voltage-current density curves and (b) IPCE curves for PPDTBT when different solvents were used with and without an additive and annealing.
Figure 12B:
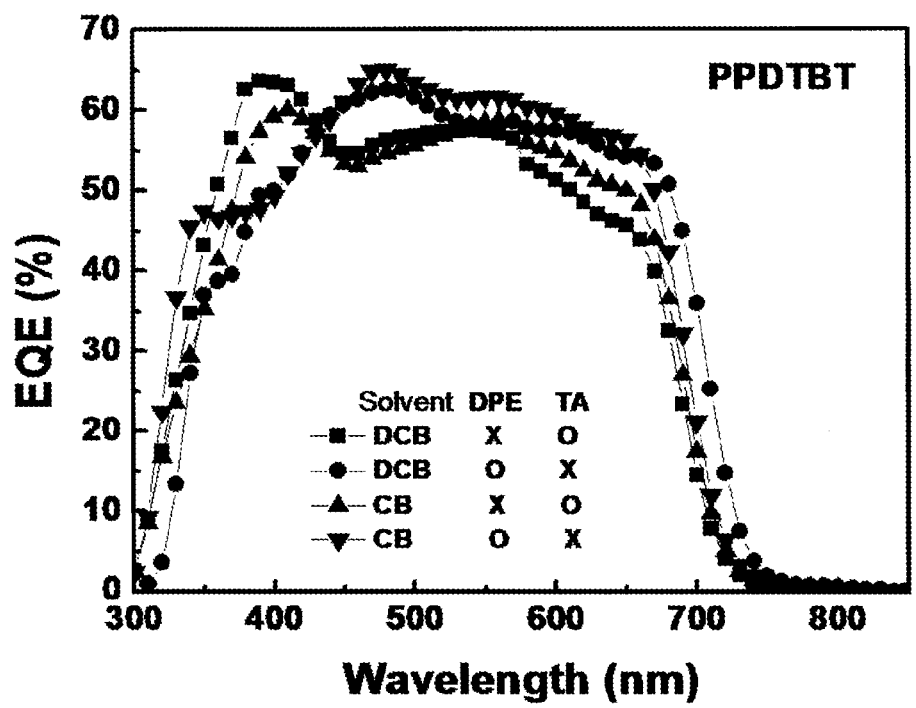
Figure 13A:
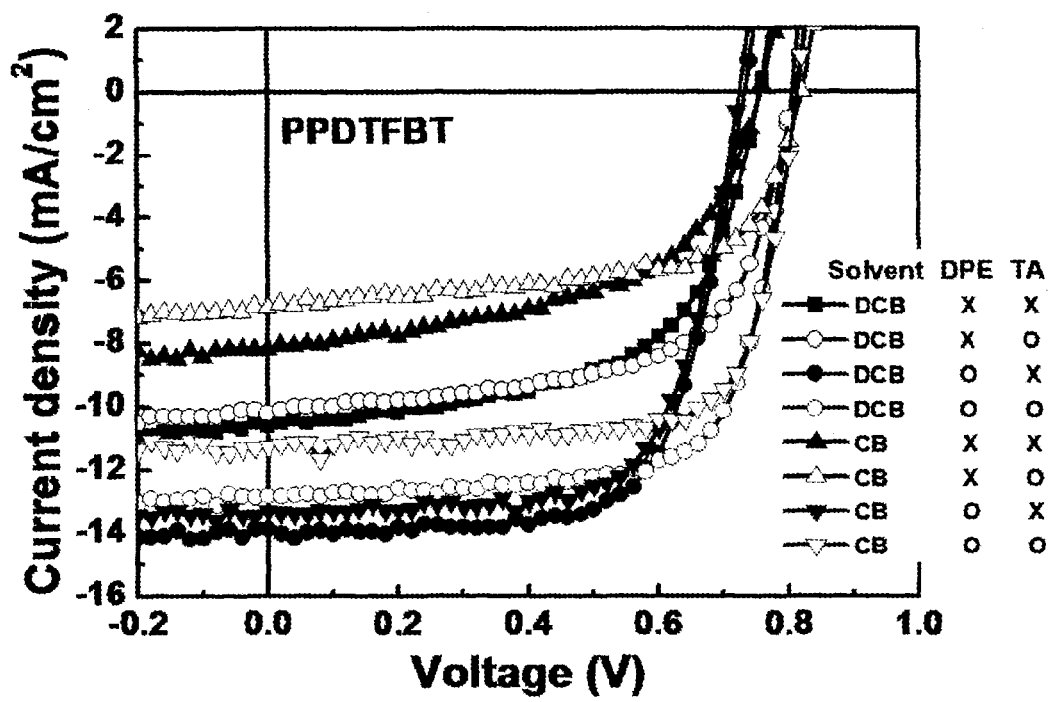
FIG. 13 shows (a) voltage-current density curves and (b) IPCE curves for PPDTFBT when different solvents were used with and without an additive and annealing.
Figure 13B:
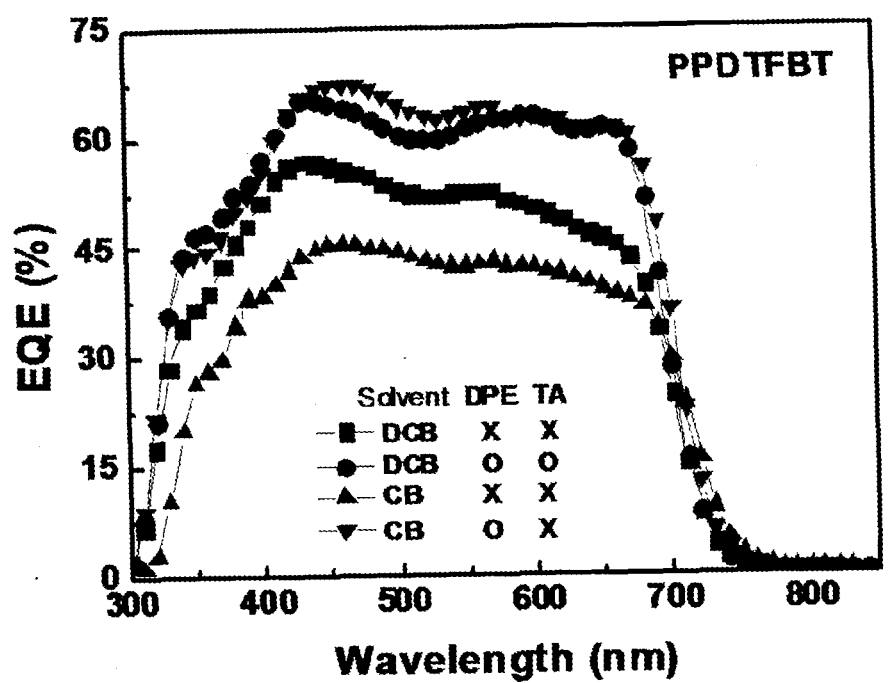
Figure 14A:
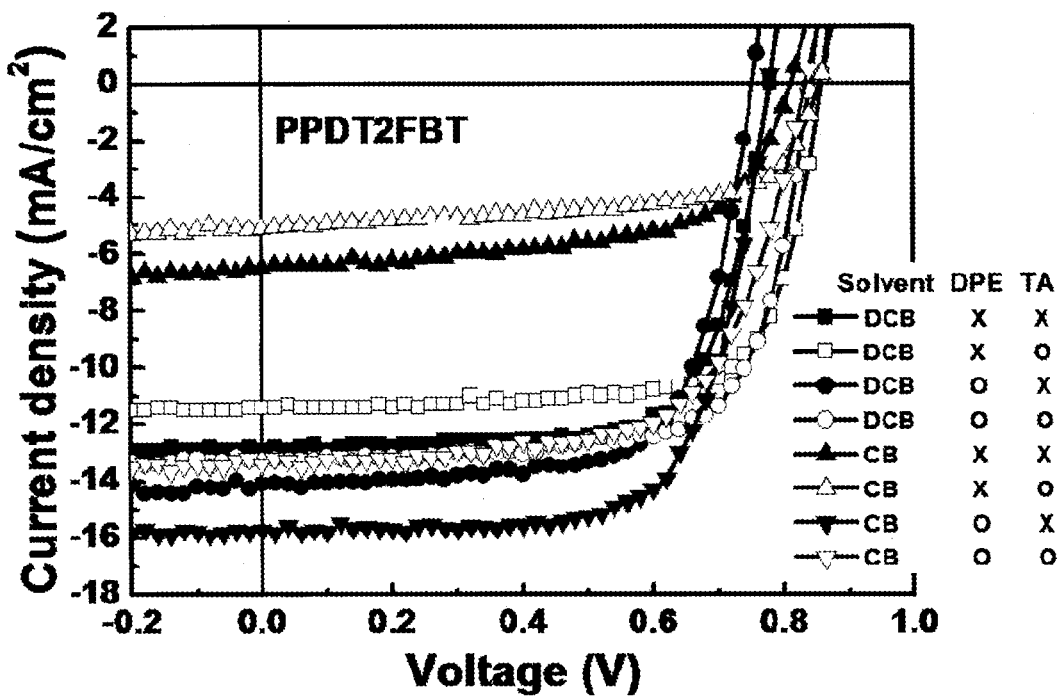
FIG. 14 shows (a) voltage-current density curves and (b) IPCE curves for PPDT2FBT when different solvents were used with and without an additive and annealing.
Figure 14B:
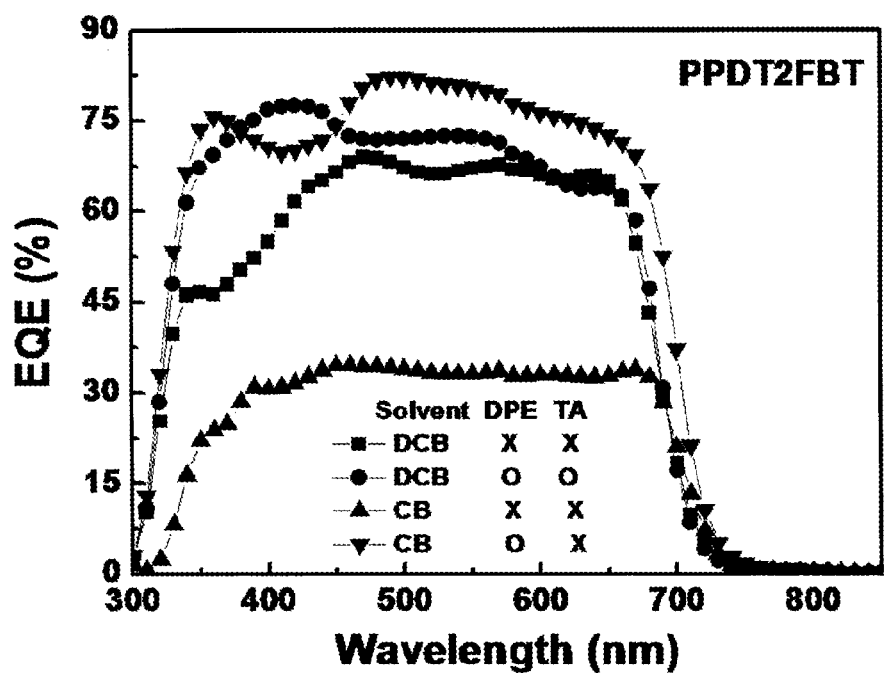

The results obtained in Test Examples 1-2 and 1-3, i.e. the characteristics of the organic thin-film solar cell devices using different solvents with and without thermal annealing and an additive, are summarized in Table 5. FIGS. 12-14 show (a) voltage-current density curves and (b) external quantum efficiencies (EQE) for the polymers.

TABLE 5

| Solvent | Additive (DPE) | Thermal annealing[a] | $J_{sc}$ (mA/cm$^2$) | $V_{oc}$ (V) | FF | PCE (%) | Jsc [Cal.] (mA/cm$^2$) |
|---|---|---|---|---|---|---|---|
| PPDTBT DCB | X | X | 9.77 | 0.76 | 0.58 | 4.27 | — |
|  |  | ○ | 10.40 | 0.81 | 0.61 | 5.08 | 10.53 |
|  | ○ | X | 11.79 | 0.73 | 0.61 | 5.25 | 11.83 |
|  |  | ○ | 10.24 | 0.79 | 0.65 | 5.23 |  |
| CB | X | X | 10.40 | 0.74 | 0.54 | 4.13 | — |
|  |  | ○ | 10.30 | 0.80 | 0.61 | 5.02 | 10.75 |
|  | ○ | X | 11.73 | 0.70 | 0.63 | 5.17 | 11.77 |
|  |  | ○ | 9.38 | 0.76 | 0.67 | 4.71 |  |
| PPDTFBT DCB | X | X | 10.60 | 0.76 | 0.59 | 4.72 | 10.33 |
|  |  | ○ | 10.2 | 0.81 | 0.62 | 5.11 |  |
|  | ○ | X | 13.88 | 0.73 | 0.69 | 7.03 | — |
|  |  | ○ | 12.84 | 0.81 | 0.72 | 7.39 | 12.39 |
| CB | X | X | 8.14 | 0.76 | 0.55 | 3.36 | 8.71 |
|  |  | ○ | 6.87 | 0.82 | 0.64 | 3.58 |  |
|  | ○ | X | 13.29 | 0.73 | 0.69 | 6.64 | 12.88 |
|  |  | ○ | 11.27 | 0.81 | 0.73 | 6.66 |  |
| PPDT2FBT DCB | X | X | 12.90 | 0.78 | 0.71 | 7.18 | 12.73 |
|  |  | ○ | 11.40 | 0.86 | 0.74 | 7.26 |  |
|  | ○ | X | 14.09 | 0.75 | 0.70 | 7.41 | — |
|  |  | ○ | 13.26 | 0.84 | 0.71 | 7.97 | 13.75 |
| CB | X | X | 6.46 | 0.81 | 0.61 | 3.22 | 6.84 |
|  |  | ○ | 5.08 | 0.86 | 0.64 | 2.78 |  |
|  | ○ | X | 15.73 | 0.78 | 0.71 | 8.64 | 15.59 |
|  |  | ○ | 13.40 | 0.84 | 0.65 | 7.28 |  |

([a]Thermal annealing at 130° C. for 10 min)

As can be seen from the results in Table 5, as the number of F atoms introduced increased, the power conversion efficiency (PCE) increased in the order: PPDTBT<PPDFTBT<PPDT2FBT. The highest efficiency was obtained in the device using PPDT2FBT.

Particularly, when dichlorobenzene was used as a solvent and diphenyl ether was added as an additive, the PPDT2FBT device having the highest efficiency showed a short-circuit current of 13.26 mA/cm$^2$, an open-circuit voltage of 0.84V, and a fill factor of 0.71, achieving a power conversion efficiency (PCE) of 7.97%. When chlorobenzene was used as a solvent and diphenyl ether was added as an additive, the PPDT2FBT device showed a short-circuit current of 15.73 mA/cm$^2$, an open-circuit voltage of 0.73V, and a fill factor of 0.71, achieving a higher power conversion efficiency (PCE) of 8.64%. The power conversion efficiencies obtained by the use of the additive only are the highest values reported so far for bulk-heterojunction solar cell devices.

Thus, the characteristics of the devices were analyzed depending on the kind of the solvent and with and without annealing and the additive. FIG. 15 shows UV-Vis absorption spectra of the polymers when different solvents were used with and without thermal annealing. FIG. 16 shows UV-Vis absorption spectra of the polymers when different solvents were used with and without the additive. FIG. 17 shows AFM images of the polymers when different solvents were used with and without annealing and the additive. FIG. 18 shows the results of SCLC analysis for PPDT2FBT.

Figure 15A:
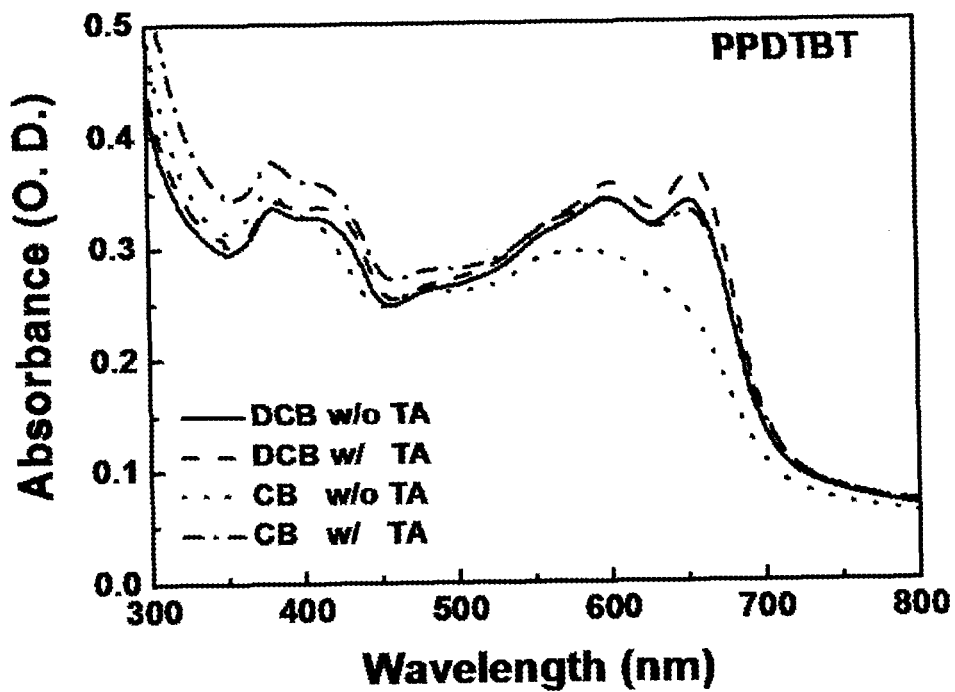
FIG. 15 shows UV-Vis absorption spectra of (a) PPDTBT, (b) PPDTFBT, and (c) PPDT2FBT when different solvents were used with and without thermal annealing.
Figure 15B:
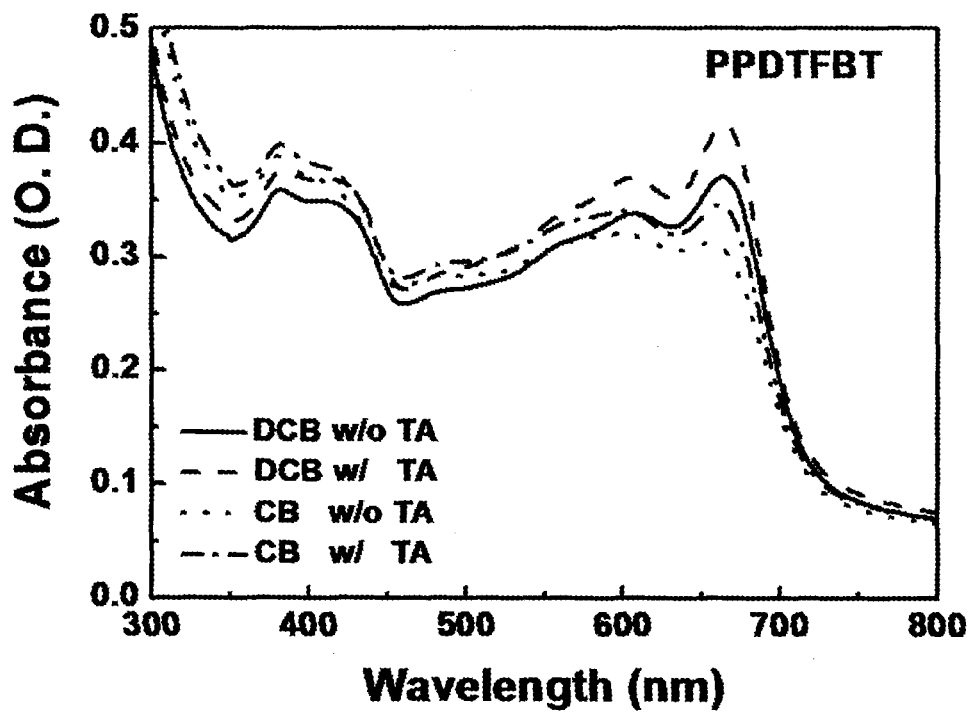
Figure 15C:
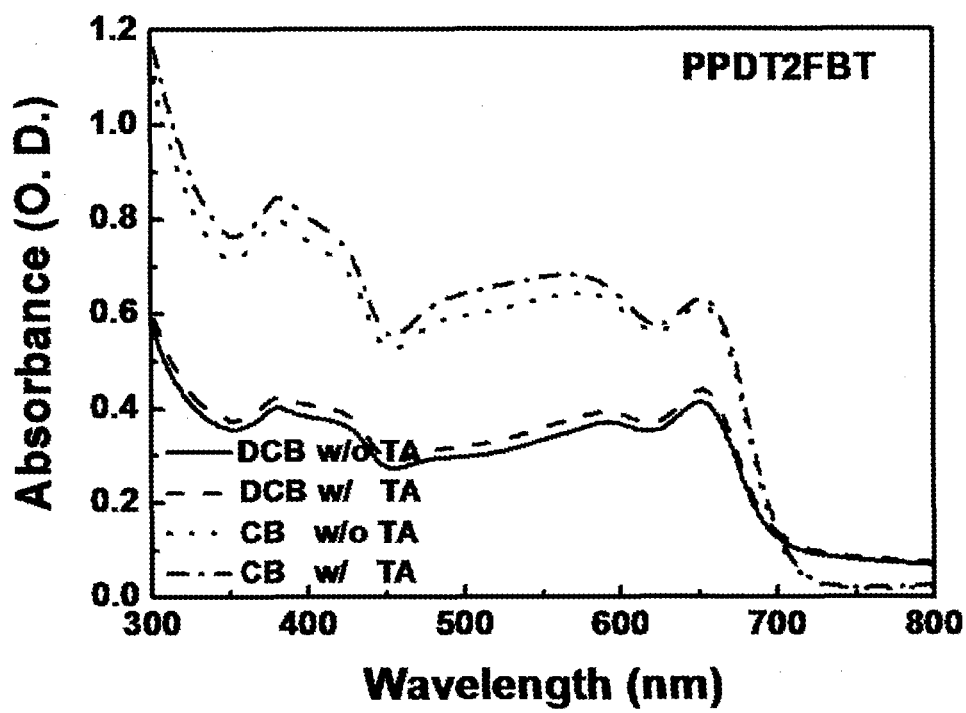
Figure 16A:
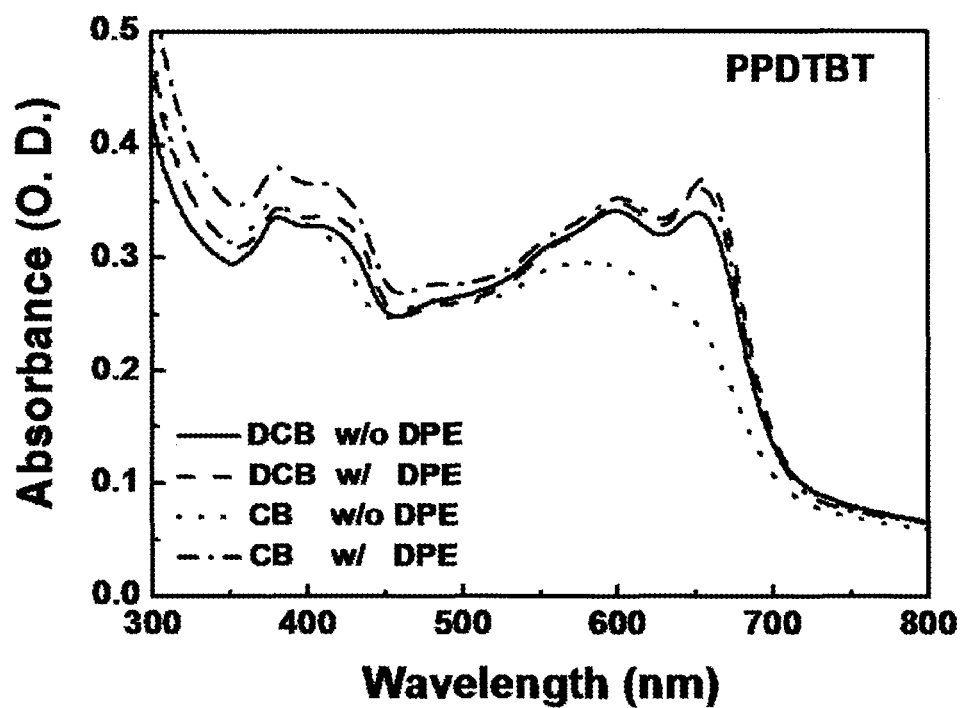
FIG. 16 shows UV-Vis absorption spectra of (a) PPDTBT, (b) PPDTFBT, and (c) PPDT2FBT when different solvents were used with and without an additive.
Figure 16B:
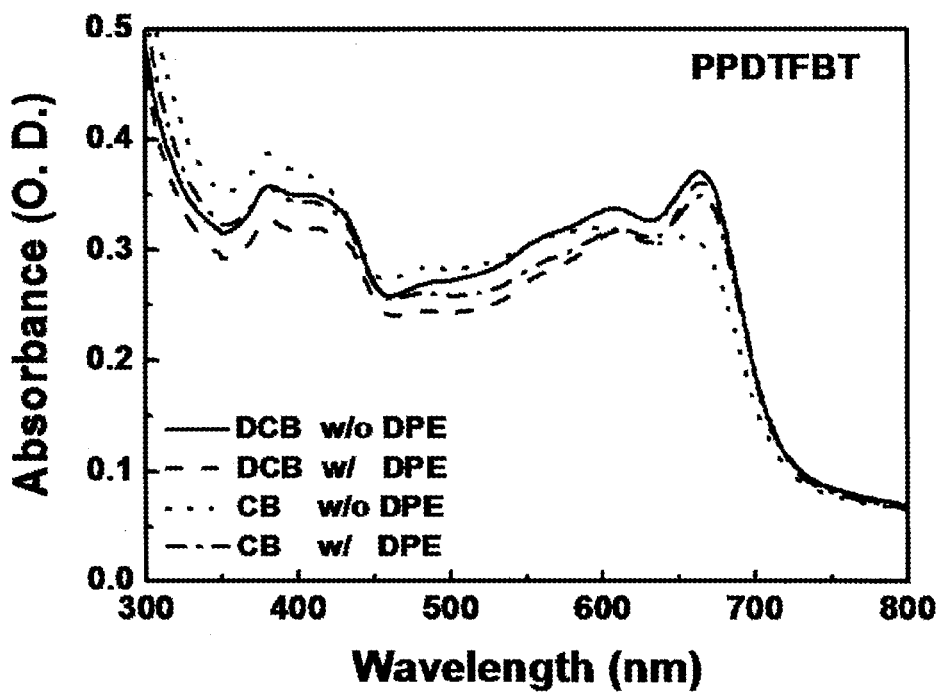
Figure 16C:
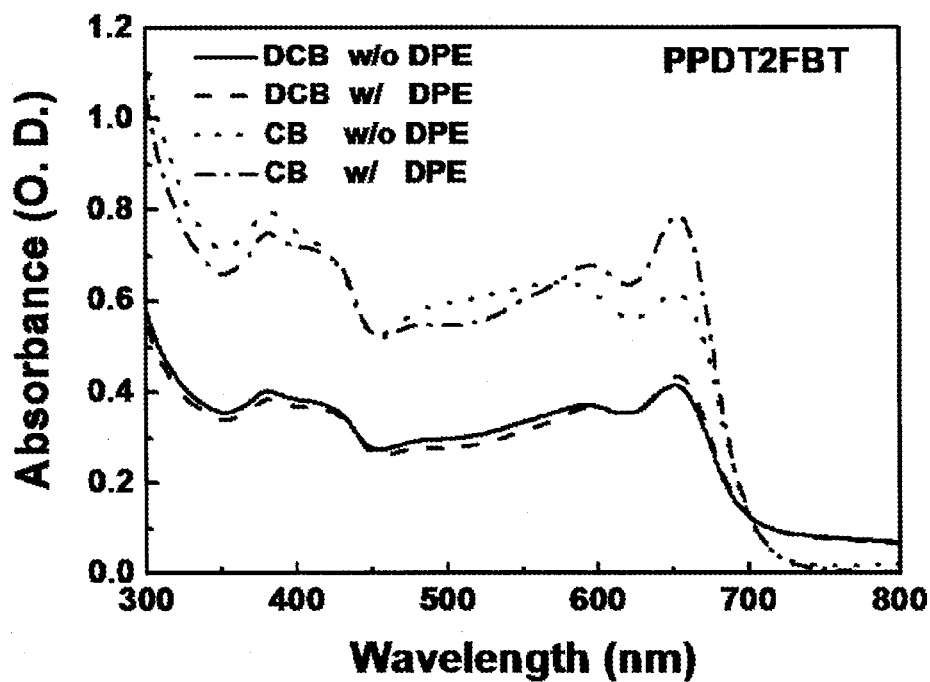

Referring to FIGS. 15 and 16, vibronic shoulder peaks were observed for PPDTBT except the case where chlorobenzene was used and diphenyl ether was not added (FIG. 15a and FIG. 16a). In contrast, for PPDTFBT (FIG. 15b and FIG. 16b) and PPDT2FBT (FIG. 15c and FIG. 16c), the vibronic shoulder peaks remained unchanged with slight intensity changes, irrespective of the addition of diphenyl ether. These results are believed to be because the fluorinated polymers PPDTFBT and PPDT2FBT per se were semi-crystalline to some extent even when the additive was not used.

Figure 17A:
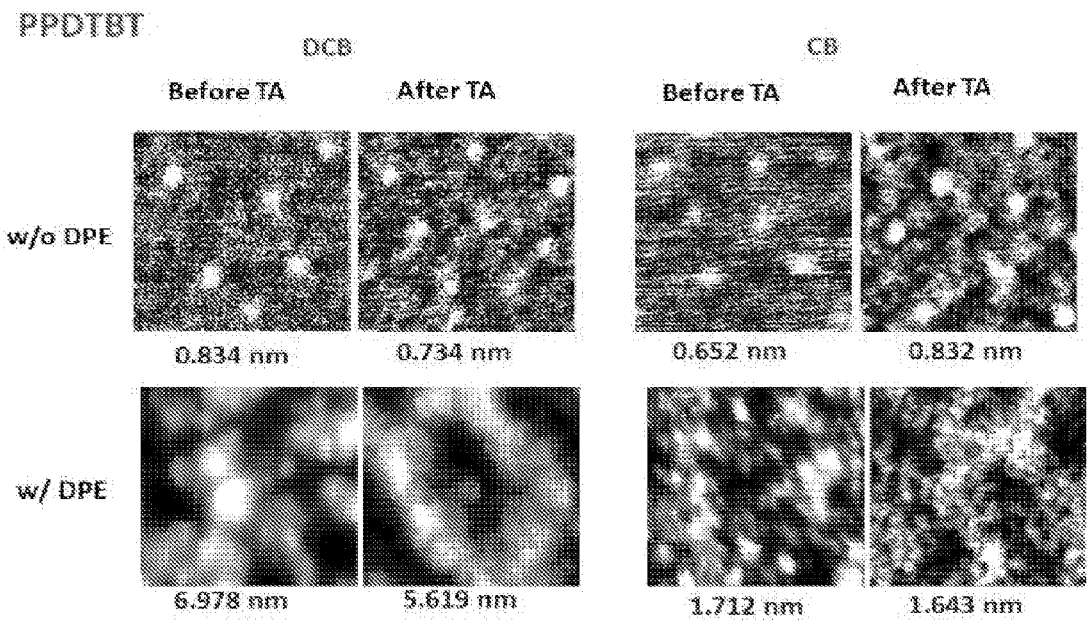
FIG. 17 shows AFM images of (a) PPDTBT, (b) PPDTFBT, and (c) PPDT2FBT when different solvents were used with and without annealing and an additive.
Figure 17B:
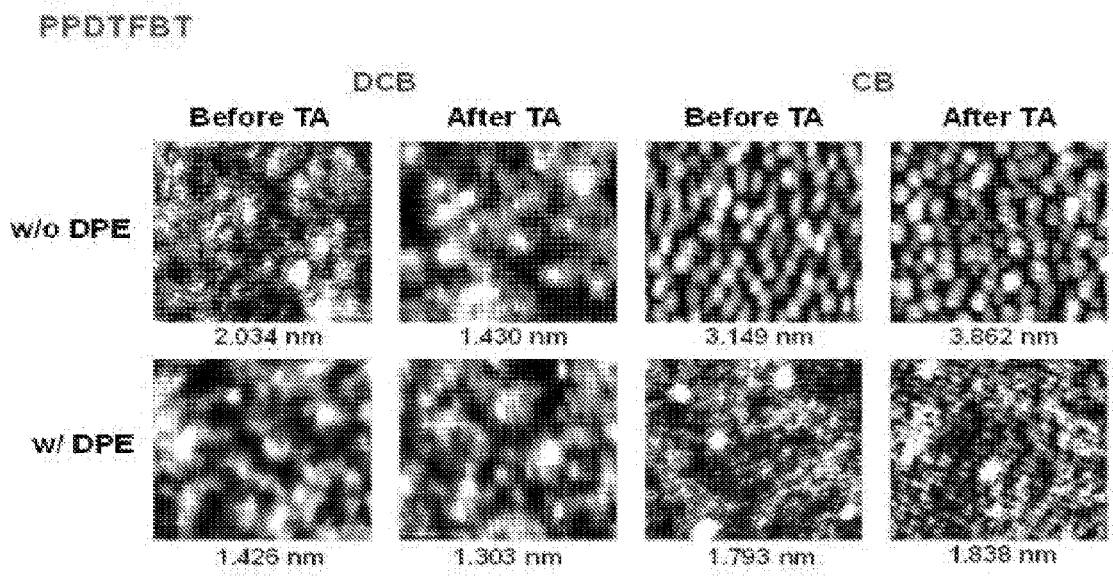
Figure 17C:
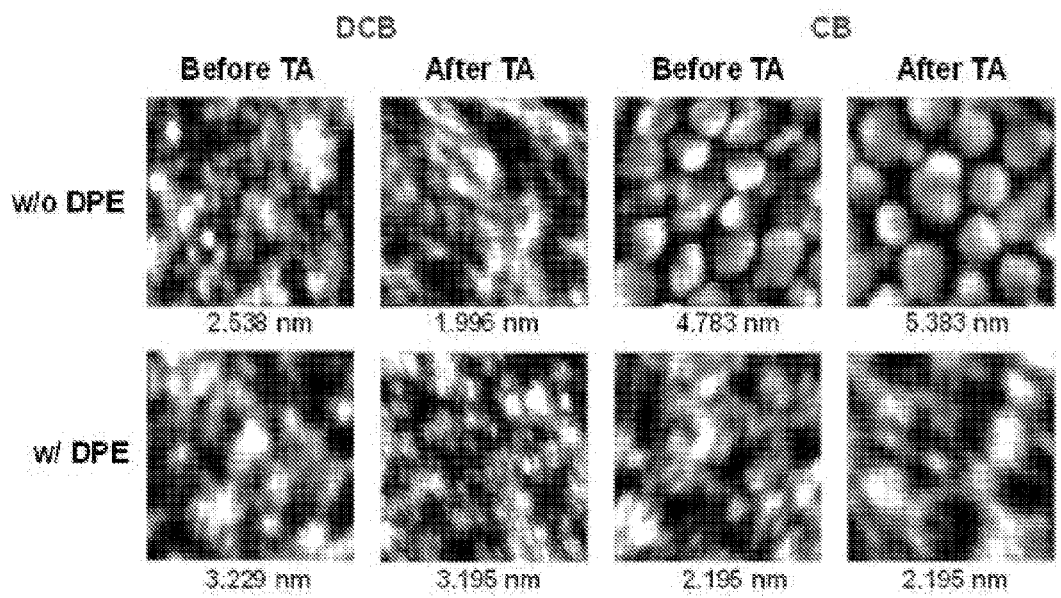
Figure 18A:
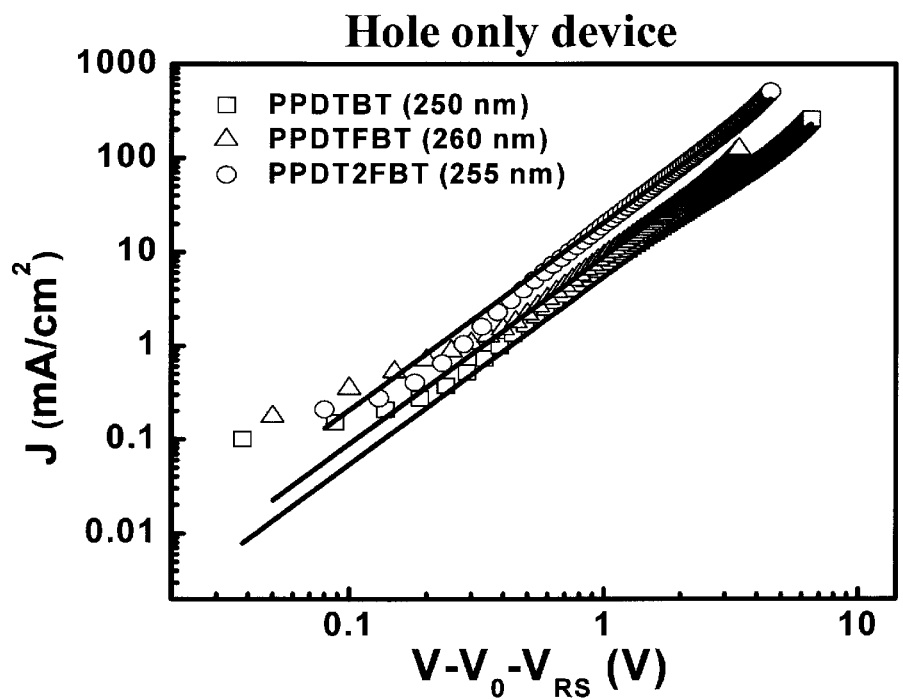
FIG. 18 shows the results of space charge limited current (SCLC) analysis for PPDT2FBT.
Figure 18B:
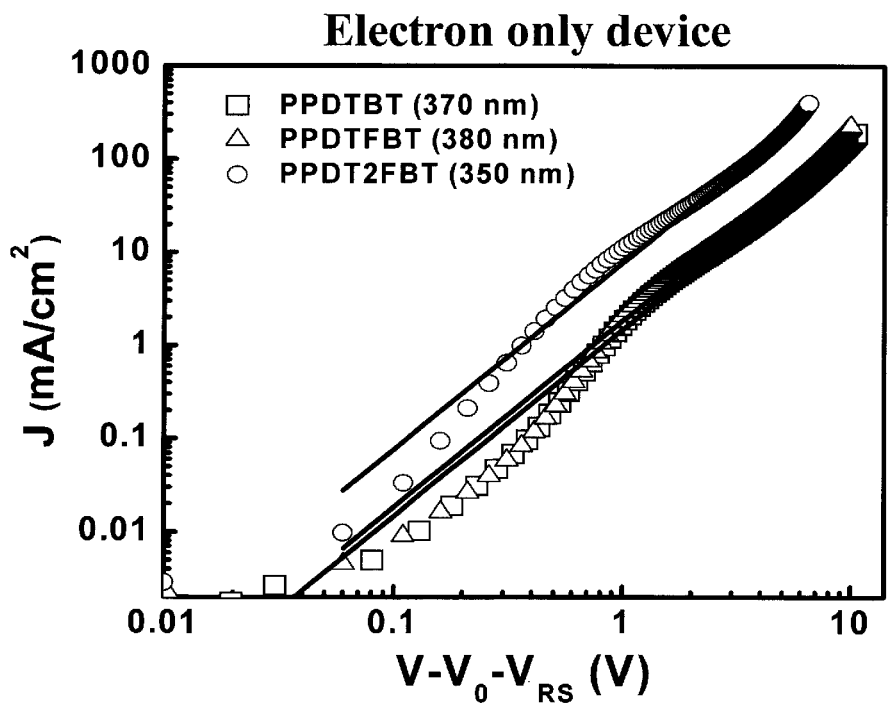

In this regard, the morphologies of the photoactive layers were analyzed with reference to the AFM image of FIG. 17. For PPDTBT (FIG. 17a), no significant morphological changes were observed irrespective of annealing, the use of the solvent, and the addition of the additive.

For PPDTFBT (FIG. 17b), the use of dichlorobenzene and chlorobenzene produced considerable differences. When dichlorobenzene was used with annealing, good phase separation between the donor and the acceptor was observed. The same phenomenon was observed even after the addition of diphenyl ether. However, when chlorobenzene was used without the additive, severe aggregation occurred, and as a result, sufficient phase separation did not occur. Good phase separation ensures sufficient migration paths of electrons and holes, thus greatly affecting device efficiency. Such results explain the reason why all efficiency determinants were low when chlorobenzene was used as a solvent without the additive, as revealed in Test Examples 1-2 and 1-3. That is, when the additive was used and annealing was performed, sufficient phase separation occurred, leading to an increase in efficiency.

Pronounced differences were found for PPDT2FBT (FIG. 17c) compared to for PPDTFBT. The morphologies show that severe aggregation occurred when chlorobenzene was used. This explains the reason why PPDT2FBT was lowest in efficiency among the three materials when chlorobenzene was used as a solvent without the additive in Experimental Example 1. Sufficient phase separation occurred, and as a result, large morphological changes were detected when chlorobenzene was used as a solvent and diphenyl ether was added as an additive, unlike the other cases. As a result, a power conversion efficiency as high as 8.64% were obtained for PPDT2FBT.

FIG. 18 shows the hole mobilities (a) and electron mobilities (b) of PPDT2FBT, which were obtained by the analysis of space charge limited current (SCLC) models. It can be confirmed from FIG. 18 that when dichlorobenzene was used as a solvent without the additive, the hole/electron mobility ratio approached 1. This result explains the reason why a high fill factor was obtained when dichlorobenzene was used. Also when dichlorobenzene was used as a solvent and diphenyl ether was added, similar results were obtained with further improved hole and electron mobilities. These results explain the increased short-circuit currents by the addition of the additive.

Also when chlorobenzene was used as a solvent, similar results were obtained. Particularly, hole and electron mobilities were about 10 times higher when chlorobenzene was used as a solvent with the additive than when dichlorobenzene was used as a solvent and when chlorobenzene was used as a solvent without the additive. These results are noticeable. Referring to Table 5, the high short-circuit current of 15.73 mA/cm$^2$ is closely related to the improved mobilities. The device could achieve a high incident photon to current conversion efficiency (IPCE) of 82.3% as well as the high short-circuit current.

TEST EXAMPLE 1-4

Analysis of Stability of the Organic Thin-Film Solar Cell Devices

The device stabilities of the three polymers PPDTBT, PPDTFBT, PPDT2FBT prepared in Synthesis Example 2 were measured over a period of 200 h. The results are graphically and numerically shown in FIG. 19.

Figure 19A:
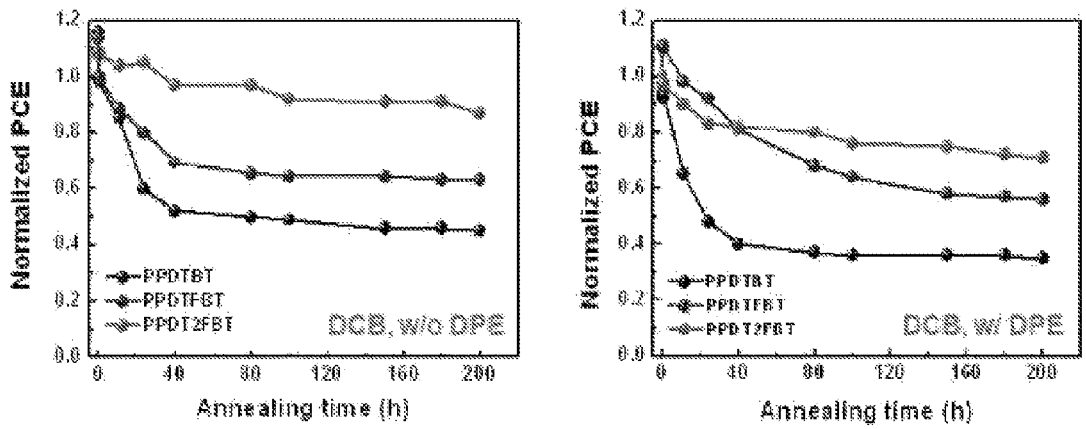
FIG. 19 graphically shows the device stabilities of PPDTBT, PPDTFBT, and PPDT2FBT.
Figure 19B:
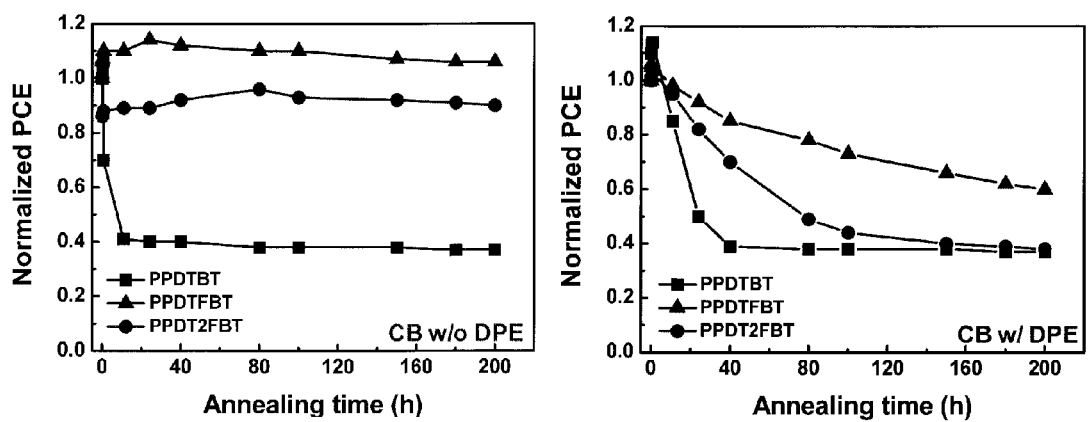

Referring to FIGS. 19a and 19b, the fluorinated polymers PPDTFBT and PPDT2FBT were more thermally stable than the non-fluorinated polymer PPDTBT.

The devices fabricated using dichlorobenzene or chlorobenzene as a solvent with diphenyl ether were less thermally stable than the devices fabricated without diphenyl ether but the PPDTFBT and PPDT2FBT devices were very stable for 200 h compared to the PPDTBT devices. They are the highest thermal stabilities, which have not been reported so far. The enhanced thermal stabilities are believed to be because the introduction of F element minimized undesired steric hindrance within the polymers to increase the interactions between the polymer molecules. The hydrophobic nature of fluorine is predicted to block the penetration of hydrophilic substances, such as oxygen and water, into the devices and prevent the characteristics of the devices from deteriorating.

TEST EXAMPLE 2

Fabrication and Analysis of Organic Solar Cell Devices

From the results of Test Example 1, it was confirmed that PPDT2FBT showed high efficiency in the conventional-type structures. In this test example, the characteristics of the polymer in inverted structures were confirmed.

Figure 20:
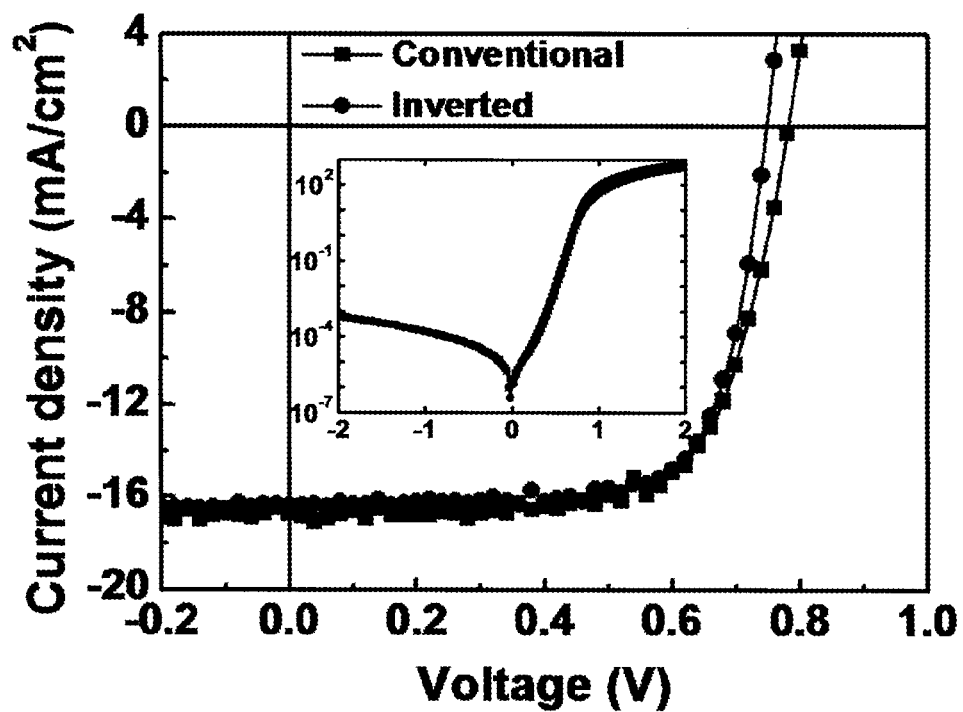
FIG. 20 shows voltage-current density curves for PPDT2FBT in conventional and inverted structures.
Figure 21:
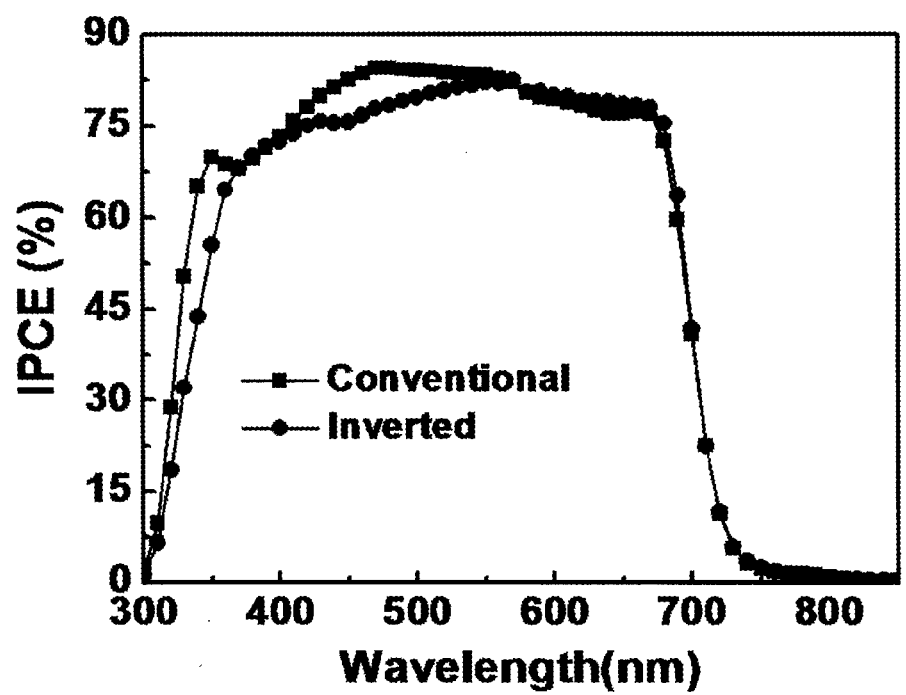
FIG. 21 shows IPCE curves for PPDT2FBT in conventional and inverted structures.
Figure 22:
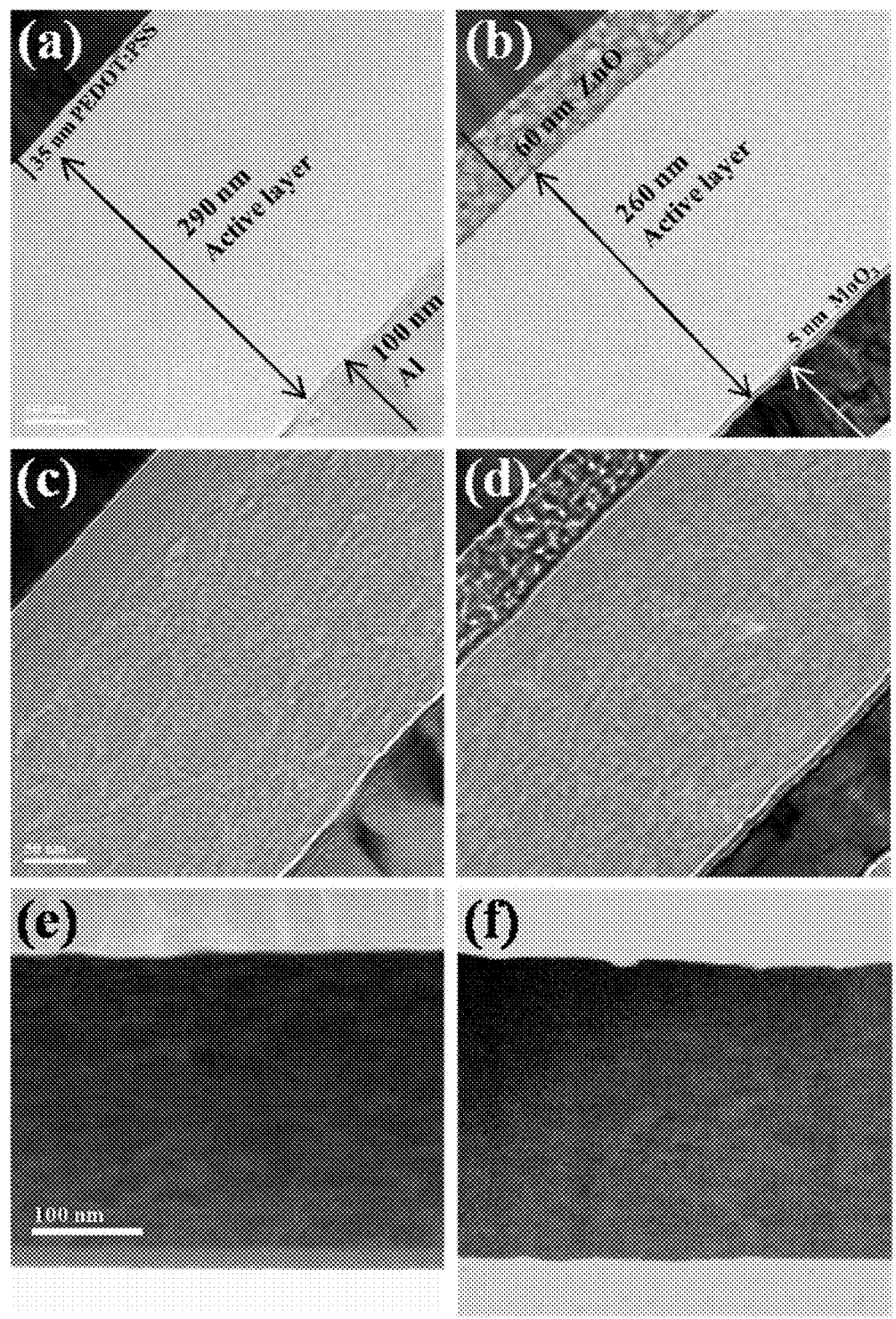
FIG. 22 shows cross-sectional TEM images of photoactive layers including PPDT2FBT in conventional and inverted structures.

FIGS. 20 and 21 show voltage-current density curves and IPCE curves for PPDT2FBT in conventional and inverted structures. The results are shown in Table 6. FIG. 22 shows cross-sectional TEM images of photoactive layers including PPDT2FBT in the conventional and inverted structures.

TABLE 6

| Type | Thickness (nm) | Jsc (mA/cm$^2$) | Voc (V) | FF | PCE (%) | Jsc [Cal.] (mA/cm$^2$) |
|---|---|---|---|---|---|---|
| Conventional | 290 | 16.72 | 0.78 | 0.69 | 9.07 | 16.43 |
| Inverted | 260 | 16.37 | 0.75 | 0.73 | 8.91 | 16.12 |

The results in Table 6 show that the conventional- and inverted-type PPDT2FBT-based polymer solar cells (PSCs) included 290 nm and 260 nm thick photoactive layers and showed high power conversion efficiencies (PCE) of 9.07% and 8.91%, respectively (see FIG. 21).

The cross-sectional TEM images of FIG. 22 explain the reason for high device performance characteristics in the conventional and inverted structures at thicknesses around 300 nm, i.e. high fill factors at the large thicknesses. The same phase separation in the vertical direction was observed in both conventional (FIGS. 22 a, c, and e) and inverted structures (FIGS. 22 b, d, and f).

Particularly, FIG. 22 shows in-focus (a) and de-focus images (c and e) in the conventional structure and in-focus (b) and de-focus images (d and f) in the inverted structure. The de-focus images in each structure show that nano-fibrillar structured morphologies were uniformly distributed in the vertical direction.

Due to the uniform morphologies, both conventional- and inverted-type devices showed equally high efficiencies at small and large thicknesses.

Figure 23:
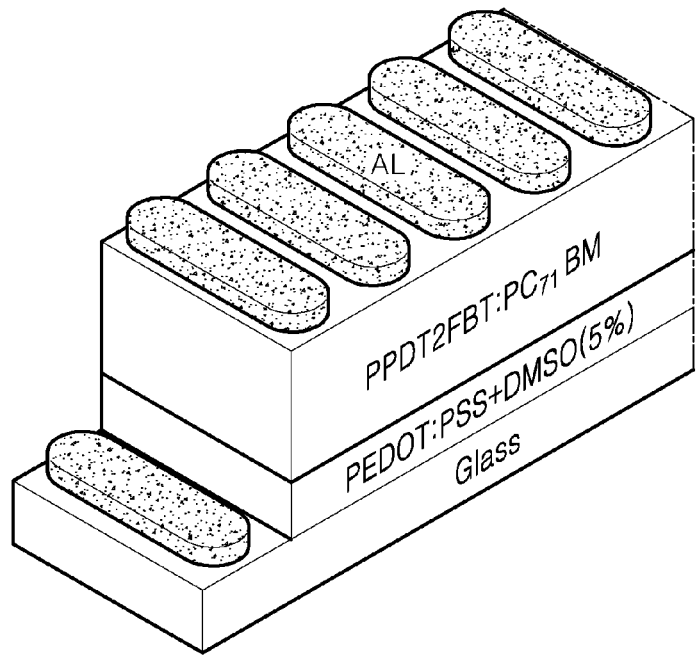
FIG. 23 diagrammatically shows conventional- and inverted-type PPDT2FBT-based ITO-free PSCs.
Figure 23:
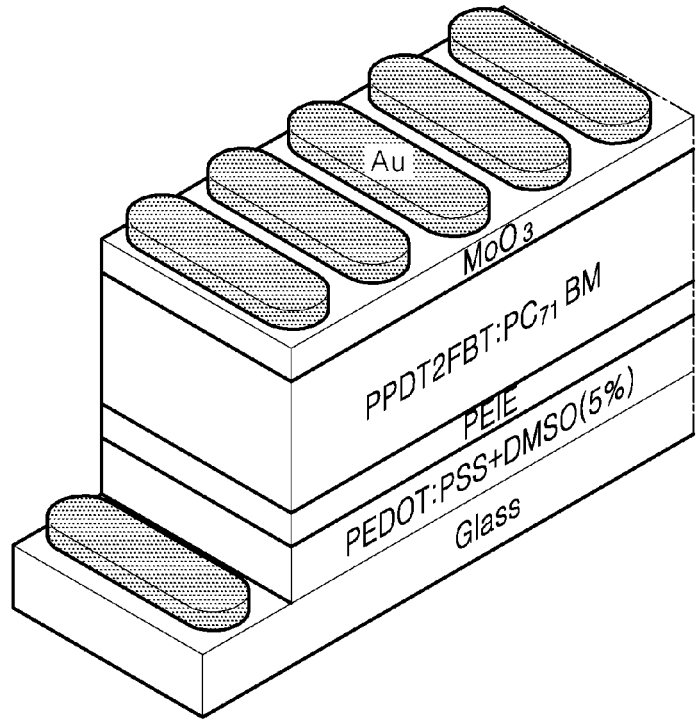

FIG. 23 diagrammatically shows conventional- and inverted-type PPDT2FBT-based ITO-free PSCs.

The conventional structure used a mixture of PEDOT:PSS (PH1000) and 5% DMSO as an electrode material for an anode (Modi-PH1000). In the inverted structure, the same electrode (Modi-PH1000) was used and a polyethylenimine ethoxylated (PETE) layer as a cathode was introduced thereon. The PEIE layer serves to increase the work function of Modi-PH1000.

Figure 24:
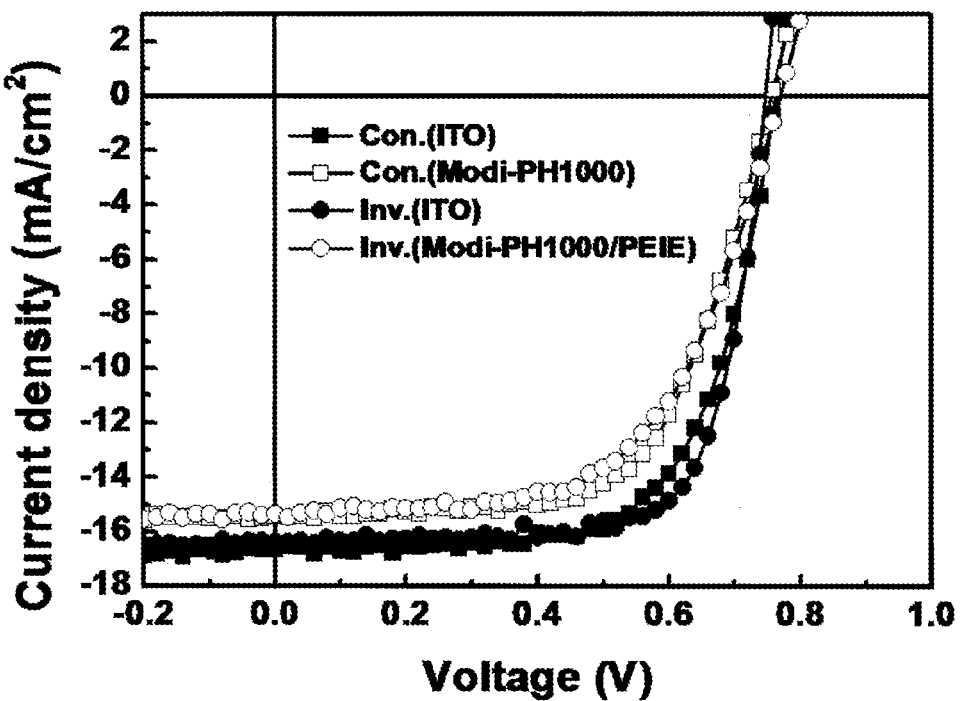
FIG. 24 shows voltage-current density curves for PPDT2FBT in conventional and inverted structures.
Figure 25:
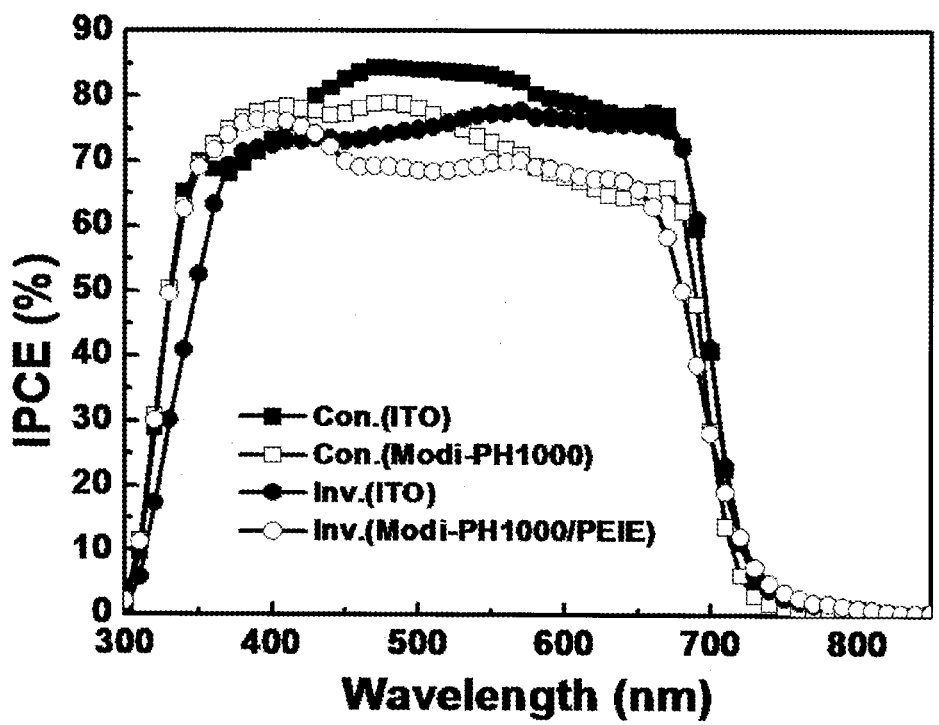
FIG. 25 shows IPCE curves for PPDT2FBT in conventional and inverted structures.

FIGS. 24 and 25 show voltage-current density curves and IPCE curves for PPDT2FBT in conventional and inverted structures. The results are shown in Table 7.

TABLE 7

| Polymer | Type | Electrode | $J_{sc}$ (mA/cm$^2$) | $V_{oc}$ (V) | FF | PCE (%) |
|---|---|---|---|---|---|---|
| PPDT2FBT | Conventional | ITO | 16.65 | 0.76 | 0.66 | 8.34 |
| | | Modi-PH1000 | 15.42 | 0.76 | 0.63 | 7.39 |
| | Inverted | ITO | 16.37 | 0.75 | 0.73 | 8.91 |
| | | Modi-PH1000/PEIE | 15.32 | 0.77 | 0.59 | 6.98 |

As can be seen from the results in Table 7, the conventional- and inverted-type ITO-free PSCs showed power conversion efficiencies (PCE) of 7.39 and 6.98%, respectively, which are substantially the same as those of the conventional- and inverted-type ITO-based PSCs. The ITO-free PSCs showed the highest power conversion efficiencies among current inverted-type ITO-free PSCs. The high efficiencies correspond to the greatest advantages of PPDT2FBT, as already proposed in FIG. 22.

TEST EXAMPLE 3

Surface Modification of Photoactive Layers

As in the previous test example, organic thin-film solar cell devices were fabricated using chlorobenzene as a solvent with diphenyl ether as an additive for the highest efficiencies, except that poly[9,9-bis(6'-(N,N,N-trimethylammonium)hexyl)fluorene-alt-phenylene] with bromide (PAHFP-Br) as a cationic polymer was introduced between the photoactive layer and the metal electrode.

Figure 26:
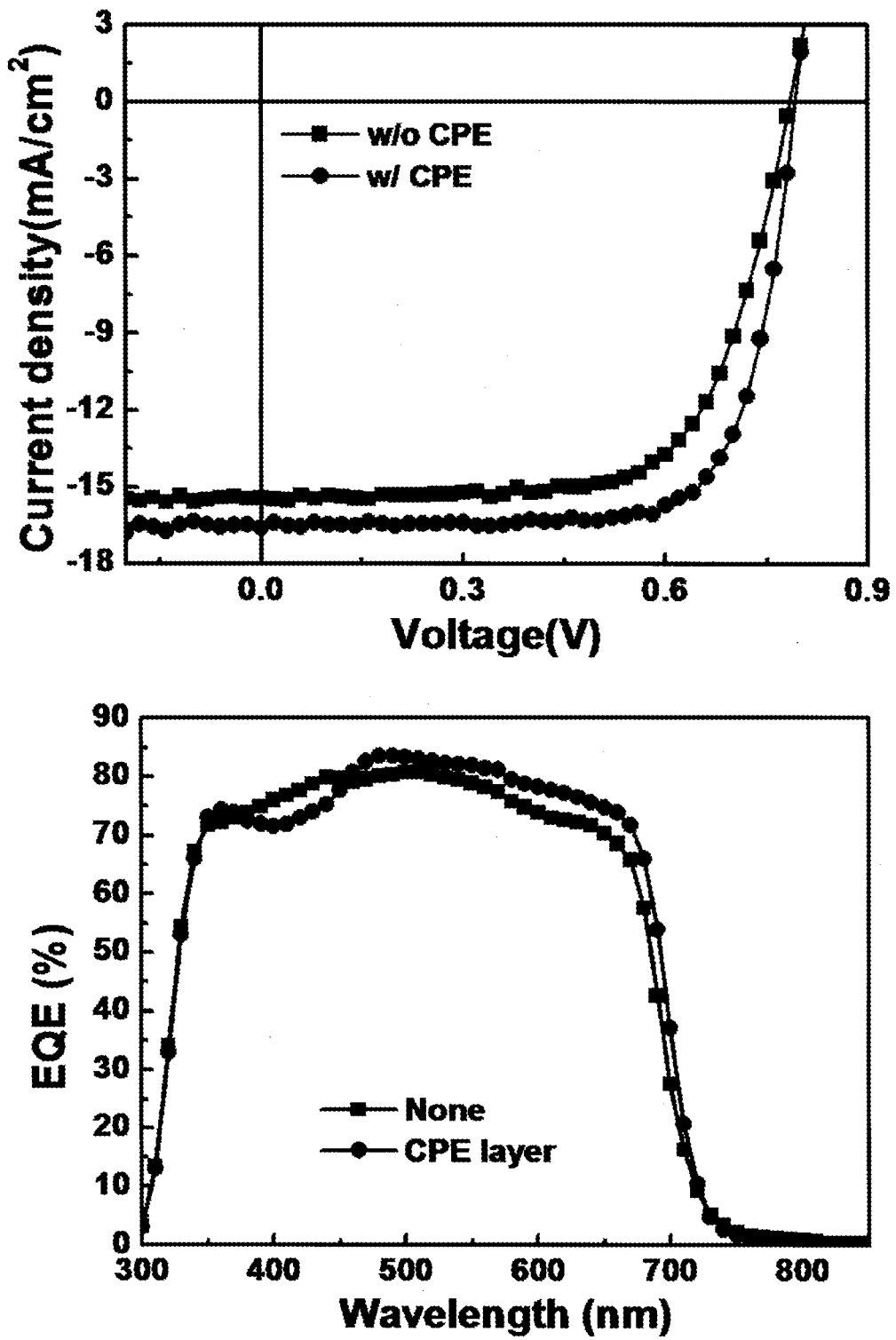
FIG. 26 shows voltage-current density curves and IPCE curves of solar cell devices including PDT2FBT before and after the introduction of a cationic polymer buffer layer.

The characteristics of the PPDT2FBT devices are shown in Table 8, and voltage-current density curves and IPCE curves of the devices are shown in FIG. 26a and FIG. 26b, respectively. The cationic polymer interposed as a buffer layer modified the surface of the photoactive layer to provide a good interface between the photoactive layer and the electrode. As a result, a short-circuit current of 16.61 mA/cm$^2$, an open-circuit voltage of 0.79 V, and a fill factor of 0.74 were obtained, achieving the highest efficiency (9.74%) reported so far for conventional polymer solar cells.

TABLE 8

| Polymer | Additive[a] | Spin-rate (rpm) | CPE layer[b] (1000 rpm) | $J_{sc}$ (mA/cm$^2$) | $V_{oc}$ (V) | FF | PCE (%) | Jsc [Cal.] (mA/cm$^2$) |
|---|---|---|---|---|---|---|---|---|
| PPDT2FBT | DPE | 1000 | X | 15.45 | 0.79 | 0.68 | 8.25 | 15.30 |
| | | | ○ | 16.61 | 0.79 | 0.74 | 9.74 | 15.94 |

[a]CB with 2% DPE as the solvent
[b]CPE solution (0.1 wt. %) dissolved in methanol was spin-cast at 1000 rpm 20 sec

TEST EXAMPLE 4

Fabrication and Analysis of Organic Thin-Film Transistor Devices

Fabrication of Organic Thin-Film Transistors

Organic polymer thin film transistor devices were fabricated by the following procedure. First, SiO$_2$ was deposited to a thickness of 200 nm on an antimony-doped Si wafer (resistance: 0.008-0.02 ohm/cm) as a gate electrode in an e-beam evaporator to form a gate insulating film. A substrate was cleaned with acetone and isopropyl alcohol, immersed in a solution of 1 wt % of octyltrichlorosilane (OTS) in toluene (1:99, vol %) for 10 min, and washed with a clear toluene solution. A solution of 1 wt % of each of PPDTBT, PPDTFBT, and PPDT2FBT prepared in Synthesis Example 2 in chlorobenzene was spin-coated on the OTS-treated substrate at 2000 rpm for 60 s to form an about 60 nm thick polymer semiconductor layer. The resulting structure was placed in a thermal evaporator and gold (Au) was deposited to a thickness of about 60 nm under a vacuum of less than 10$^{-6}$ Torr to form drain and source electrodes on the polymer semiconductor layer.

Characteristics of the Organic Thin-Film Transistors

Figure 27:
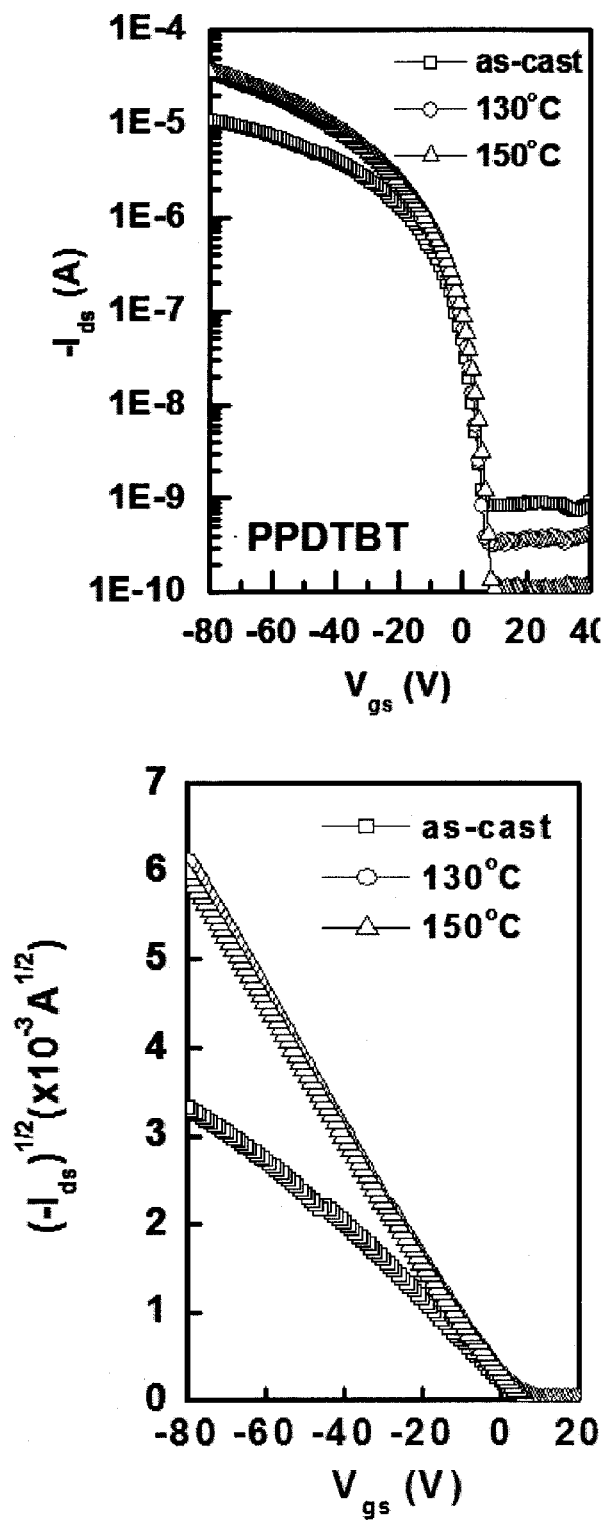
FIG. 27 shows the hole mobility, threshold voltage, and on/off ratio of an organic polymer thin-film transistor device using PPDTBT.
Figure 28:
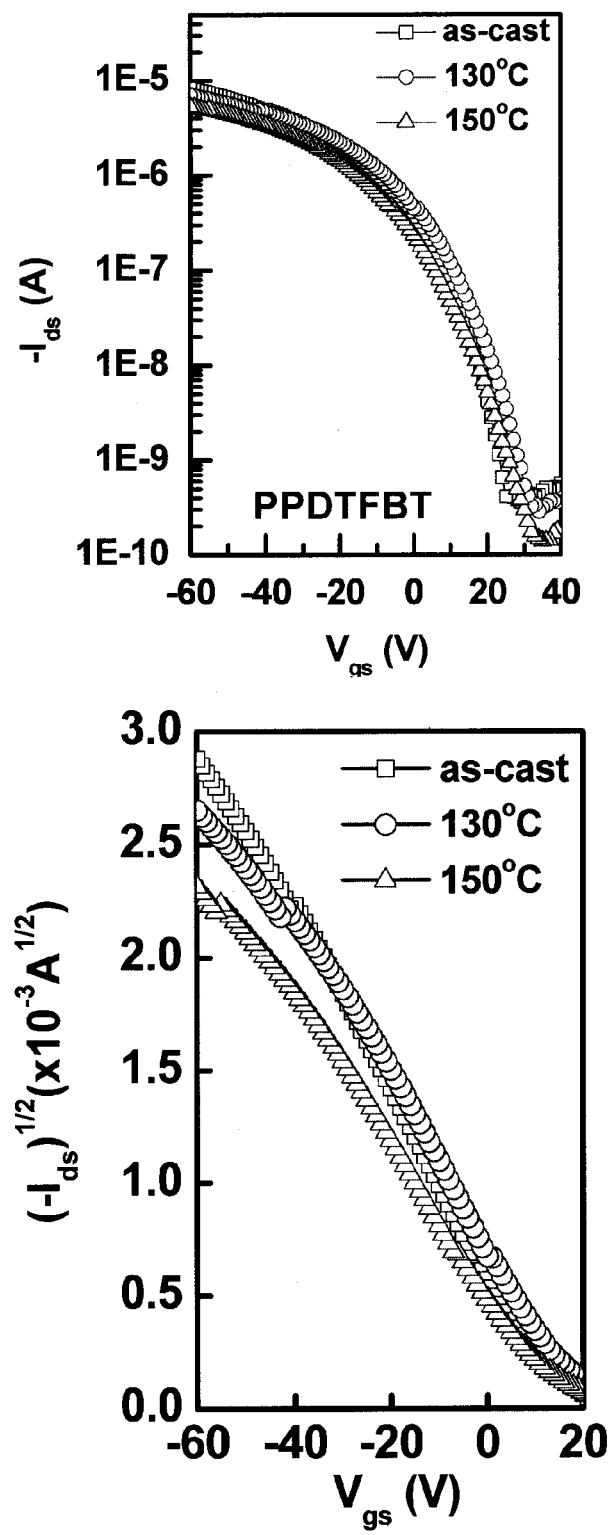
FIG. 28 shows the hole mobility, threshold voltage, and on/off ratio of an organic polymer thin-film transistor device using PPDTFBT.
Figure 29:
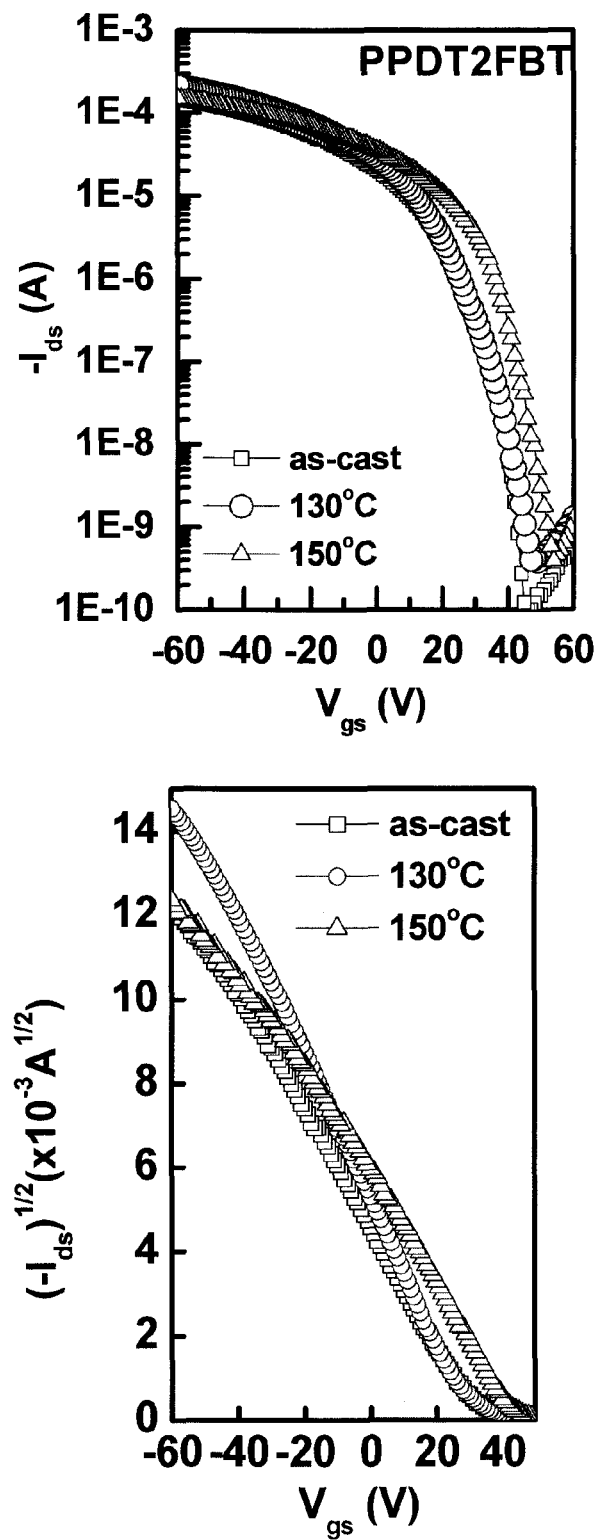
FIG. 29 shows the hole mobility, threshold voltage, and on/off ratio of an organic polymer thin-film transistor device using PPDT2FBT.

FIGS. 27 to 29 show the hole mobilities, threshold voltages, and on/off ratios of the organic polymer thin film transistor devices using the polymers PPDTBT, PPDTFBT, and PPDT2FBT, respectively.

The hole mobility (μ) can be calculated from the gate voltage ($V_{gs}$) versus drain current ($I_{ds}$) at the saturation region by Equation 1:

$$I_{ds} = (WC_i/2L) \times \mu \times (V_{gs} - V_T)^2 \quad (1)$$

where W is the width of the device, L is the length of the device, $C_i$ is the capacitance of $SiO_2$, and $V_T$ is the threshold voltage.

In FIGS. 27 to 29, the on/off ratios can be calculated from the plots of $V_{gs}$ versus $I_{ds}$, and the threshold voltages and mobilities can be derived from straight lines fitted to the plots of the inverse square root of $I_{ds}$. Referring to FIGS. 27 to 29, the on/off ratios were $8.76 \times 10^3$, $1.96 \times 10^4$, and $1.20 \times 10^6$, the threshold voltages were 6 V, 25 V, and 44 V, and the mobilities were 0.0046 cm²/Vs, 0.0036 cm²/Vs, and 0.0340 cm²/Vs for the PPDTBT, PPDTFBT, and PPDT2FBT devices, respectively. After annealing at 130° C. for 10 min, which are optimum annealing conditions for solar cell devices, the PPDTBT and PPDT2FBT devices showed improved mobilities of 0.0135 cm²/Vs and 0.0640 cm²/Vs, respectively. These values are summarized in Table 9.

TABLE 9

|  | Thermal annealing (x ° C., 10 min) | On-off ratio | Threshold voltage (V) | Mobility (cm² V⁻¹ S⁻¹) |
| --- | --- | --- | --- | --- |
| PPDTBT | None | $8.76 \times 10^3$ | 6 | 0.0046 |
|  | 130 | $6.55 \times 10^4$ | 7 | 0.0135 |
|  | 150 | $1.05 \times 10^5$ | 0 | 0.0146 |
| PPDTFBT | None | $1.96 \times 10^4$ | 25 | 0.0036 |
|  | 130 | $2.21 \times 10^4$ | 33 | 0.0031 |
|  | 150 | $3.52 \times 10^4$ | 33 | 0.0030 |
| PPDT2FBT | None | $1.20 \times 10^6$ | 44 | 0.0340 |
|  | 130 | $1.50 \times 10^6$ | 47 | 0.0640 |
|  | 150 | $5.64 \times 10^5$ | 53 | 0.0330 |

Referring to the results in Table 9, PPDT2FBT containing two F atoms showed significantly high mobilities. These results are believed to be attributed to the planarity of the polymeric backbone maintained by the interactions between S—O and F—S. The polymeric backbone became more planar through the annealing effects. As a result, good stacking between the polymer chains was ensured, leading to an about two-fold increase in hole mobility.

In the synthesis examples and test examples, the ICT type band gap polymers (PPDTBT, PPDTFBT, and PPDT2FBT) of electron-rich monomers (containing phenyl and thienyl moieties) and electron-deficient monomers (containing benzothiadiazole (BT)) were used to fabricate the highly efficient solar cell devices. A high open-circuit voltage as well as a high short-circuit current is an important factor in fabricating a highly efficient device. In view of this, one or more F atoms were introduced into the benzothiadiazole group with high electron affinity and it was observed that the fluorination lowered the HOMO levels of the polymers (|5.29→−5.35→−5.45 eV) with increasing F substitution. From the UV absorption spectra and the results of 2-dimensional grazing incidence X-ray diffraction (2D-GIXRD) analysis, it could be observed that the F substitution enhanced the crystallinity of the polymers. This can be interpreted that the interactions between the F and S atoms enhances the orientation between the adjacent molecules.

Based on such characteristics, the conventional-type organic thin-film solar cell devices were fabricated. In addition, the introduction of F, the choice of the solvents, the addition of the additive were confirmed to increase in the efficiencies of the devices (PPDTBT: 5.25%, PPDTFBT: 7.39%, and PPDT2FBT: 8.64%). Particularly, the PPDT2FBT-based device without the insertion of an additional buffer layer showed the highest efficiency value reported so far. In an attempt to further increase the device efficiency, a buffer layer was introduced by inserting a poly (fullerene-phenylene)-based conjugated polymer electrolyte between the metal electrode layer and the photoactive layer, achieving a high fill factor of 74% and a maximum efficiency of 9.74%.

In the organic polymer thin film transistor devices fabricated using the polymers PPDTBT, PPDTFBT, and PPDT2FBT, the polymeric backbones became more planar through the effects of fluorine introduction and annealing, resulting in an about two-fold increase in hole mobility.

The polymer of the present invention includes benzothiadiazole, benzoselenadiazole, benzoxadiazole, benzotriazole, quinoxaline, benzothienopyrroledione, diketopyrrolopyrrole or isoindigo with high electron affinity as an electron accepting group. The presence of the electron accepting group lowers the HOMO energy level of the polymer and allows the polymer to have a high open-circuit voltage. Particularly, one or two —F, —Cl or —CN are introduced into the electron accepting group to increase the electron affinity of the electron accepting group. The interactions between electrons decrease the torsional angle to improve the intermolecular packing characteristics while maintaining the planarity of the polymer backbone, contributing to an improvement in charge mobility. Due to these advantages, the use of the copolymer according to the present invention as a material for a photoactive layer enables the fabrication of an organic thin-film solar cell or organic thin-film transistor with very high power conversion efficiency suitable for commercialization.

INDUSTRIAL APPLICABILITY

The copolymer of the present invention can be used as a material for a photoactive layer to fabricate an organic electronic device (for example, an organic thin-film solar cell or organic thin-film transistor) with very high power conversion efficiency suitable for commercialization.

The invention claimed is:
1. A polymer in which a compound containing an electron donating group represented by Formula 1 or 2:

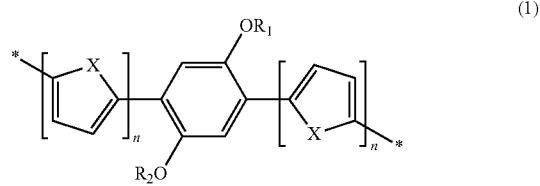

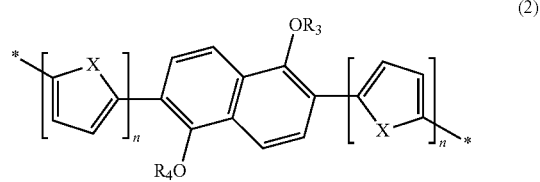

(wherein the moieties X are the same or different and each represents CRR', NR, O, SiRR', PR, S, GeRR', Se or Te; R and R' are the same or different and each represents a $C_1$-$C_{30}$ linear or branched alkyl group; $R_1$, $R_2$, $R_3$, and $R_4$ are the same or different and each represents a $C_8$-$C_{30}$ linear or branched alkyl group; and the subscripts n are the same or different and each represents an integer from 1 to 3), and a compound containing an electron accepting group represented by one of Formulae 3 to 8:

(3)
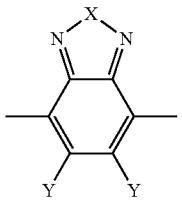

(4)
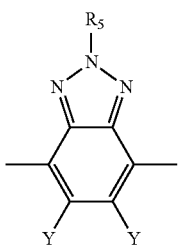

(5)
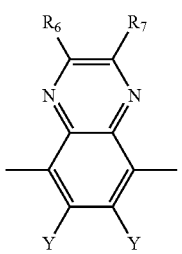

(6)
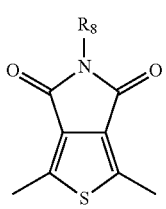

(7)
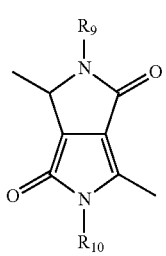

(8)
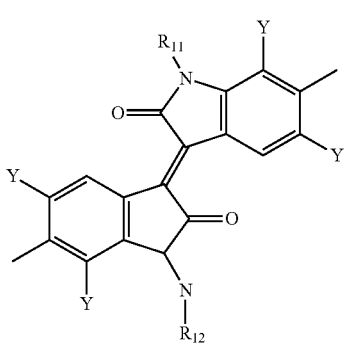

(wherein X, R, and R' are as defined in Formula 1 or 2; the groups Y are the same or different and each represents H, F, Cl or CN; and $R_5$, $R_6$, $R_7$, $R_8$, $R_9$, $R_{10}$, $R_{11}$, and $R_{12}$ are the same or different and each represents a $C_8$-$C_{30}$ linear or branched alkyl group) are repeatedly introduced in an alternating manner.

2. The polymer according to claim 1, wherein the compound containing an electron donating group is represented by Formula 1 and the compound containing an electron accepting group is represented by Formula 3.

3. The polymer according to claim 1, wherein the polymer is selected from compounds represented by Formulae 9 to 11:

(9)
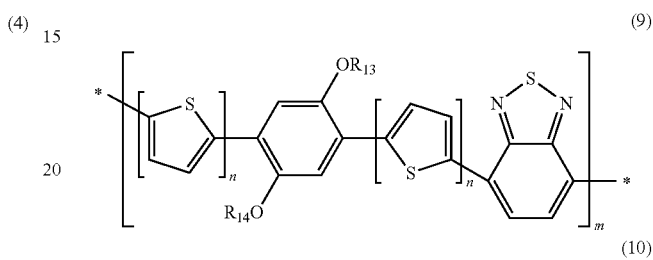

(10)
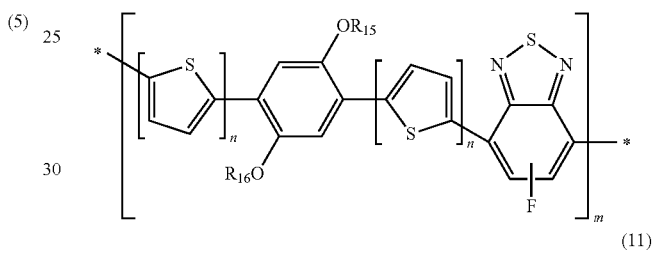

(11)
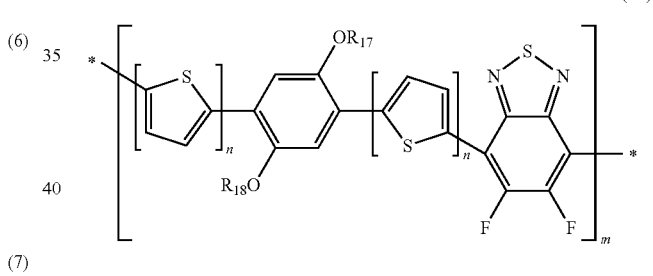

wherein each n is independently an integer from 1 to 3, each m is independently an integer from 10 to 100, and $R_{13}$, $R_{14}$, $R_{15}$, $R_{16}$, $R_{17}$, and $R_{18}$ are the same or different and each represents a $C_8$-$C_{30}$ linear or branched alkyl group.

4. The polymer according to claim 1, wherein the polymer has a number average molecular weight of 10,000 g/mol to 100,000 g/mol.

5. A method for fabricating an organic thin-film solar cell, comprising forming a sunlight-absorbing photoactive layer comprising the polymer according to claim 1 by the use of chlorobenzene as a solvent and the addition of diphenyl ether as an additive.

6. An organic thin-film solar cell comprising a sunlight-absorbing photoactive layer comprising the polymer according to claim 1.

7. The organic thin-film solar cell according to claim 6, wherein the organic thin-film solar cell is fabricated by the method according to claim 5.

8. The organic thin-film solar cell according to claim 6, further comprising a buffer layer formed between a cathode layer and the sunlight-absorbing photoactive layer and comprising a poly(fluorene-phenylene)-based conjugated polymer electrolyte (CPE).

9. The organic thin-film solar cell according to claim 8, wherein the conjugated polymer electrolyte is poly[9,9-bis(6'-(N,N,N-trimethylammonium)hexyl)fluorene-alt-phenylene]with bromide (PAHFP-Br).

10. An organic thin-film transistor comprising the polymer according to claim 1 as an active material.

* * * * *